(12) United States Patent
Bardsley et al.

(10) Patent No.: US 11,121,713 B1
(45) Date of Patent: Sep. 14, 2021

(54) BOOSTED SWITCH DRIVERS FOR HIGH-SPEED SIGNAL SWITCHING

(71) Applicant: Analog Devices, Inc., Norwood, MA (US)

(72) Inventors: Scott G. Bardsley, High Point, NC (US); Huseyin Dinc, Greensboro, NC (US)

(73) Assignee: ANALOG DEVICES, INC., Wilmington, MA (US)

( * ) Notice: Subject to any disclaimer, the term of this patent is extended or adjusted under 35 U.S.C. 154(b) by 0 days.

(21) Appl. No.: 17/007,126

(22) Filed: Aug. 31, 2020

Related U.S. Application Data

(60) Provisional application No. 63/065,590, filed on Aug. 14, 2020.

(51) Int. Cl.
| | |
|---|---|
| *H03K 3/012* | (2006.01) |
| *H03K 3/356* | (2006.01) |
| *H03K 19/00* | (2006.01) |
| *H03K 19/0185* | (2006.01) |
| *H03K 17/687* | (2006.01) |
| *H03K 17/10* | (2006.01) |

(52) U.S. Cl.
CPC ... *H03K 19/018521* (2013.01); *H03K 17/102* (2013.01); *H03K 17/6872* (2013.01); *H03K 19/01855* (2013.01)

(58) Field of Classification Search
None
See application file for complete search history.

(56) References Cited

U.S. PATENT DOCUMENTS

| | | | | |
|---|---|---|---|---|
| 5,650,742 A | * | 7/1997 | Hirano | H03K 19/018521 327/333 |
| 6,049,228 A | * | 4/2000 | Moon | H03K 19/018521 326/81 |
| 6,259,299 B1 | * | 7/2001 | Ryu | H03K 19/0013 327/333 |

(Continued)

OTHER PUBLICATIONS

Gupta et al., *CMOS Voltage Level-Up Shifter—A Review*, Special Issue: Proceedings of 2<sup>nd</sup> International Conference on Emerging Trends in Engineering and Management, ICETEM 2013, 4 pages.

(Continued)

*Primary Examiner* — Kenneth B Wells
(74) *Attorney, Agent, or Firm* — Patent Capital Group

(57) ABSTRACT

An example boosted switch driver circuit includes two branches. The first branch includes a first transistor. The second branch includes a second transistor and a level shifter circuit. One of the transistors is an N-type transistor and the other one is a P-type transistor. The circuit is configured to split an input clock signal between the first branch and the second branch, so that a portion of the input clock signal split to the first branch is provided to the first transistor, and a portion of the input clock signal split to the second branch is level-shifted by the level shifter circuit to generate a level-shifted input clock signal and the level-shifted input clock signal is provided to the second transistor. The circuit is further configured to combine an output of the first transistor and an output of the second transistor to generate an output clock signal.

42 Claims, 16 Drawing Sheets

(56) References Cited

U.S. PATENT DOCUMENTS

| | | | |
|---|---|---|---|
| 7,586,358 B2 * | 9/2009 | Park | G09G 3/3611 |
| | | | 326/68 |
| 7,701,278 B2 | 4/2010 | Herzer et al. | |
| 7,812,660 B2 * | 10/2010 | Tamura | H03K 19/0013 |
| | | | 327/333 |
| 8,624,641 B1 | 1/2014 | Faucher et al. | |
| 8,638,155 B2 | 1/2014 | Notman et al. | |
| 8,928,513 B1 | 1/2015 | Waltari | |
| 8,975,942 B2 | 3/2015 | Bardsley et al. | |
| 9,331,679 B1 * | 5/2016 | Jain | H03K 19/018521 |
| 9,559,613 B2 | 1/2017 | Ejury et al. | |
| 9,722,609 B2 | 8/2017 | Kinzer et al. | |
| 9,843,311 B2 | 12/2017 | Green et al. | |
| 9,979,397 B1 | 5/2018 | Zhu et al. | |
| 10,062,450 B1 | 8/2018 | Moore et al. | |
| 2020/0076427 A1 | 3/2020 | Burgener et al. | |

OTHER PUBLICATIONS

Balogh, *Design and Application Guide for High Speed MOSFET Gate Drive Circuits*, Computer Science, Published 2006, 37 pages.

Technical Article, MS-2318, *Design Fundamentals of Implementing an Isolated Half-Bridge Gate Driver*, Analog Devices, © 2012, 4 pages.

Ali et al., *A 12b 18GS/s RF Sampling ADC with an Integrated Wideband Track-and-Hold Amplifier and Background Calibration*, ISSCC 2020, Session 16, Nyquist & VCO-Based ADCs, 16.1, 3 pages.

Application Report, *Fundamentals of MOSFET and IGBT Gate Driver Circuits*, SLUA618A, Mar. 2017 (Revised Oct. 2018), Texas Instruments, 48 pages.

* cited by examiner

BOOSTED SWITCH DRIVERS FOR HIGH-SPEED SIGNAL SWITCHING

CROSS REFERENCE TO RELATED APPLICATIONS

This application is claims the benefit of and priority from U.S. Patent Application No. 63/065,590, filed Aug. 14, 2020, titled "BOOSTED SWITCH DRIVERS FOR HIGH-SPEED SIGNAL SWITCHING," the disclosure of which is hereby incorporated by reference herein in its entirety.

TECHNICAL FIELD OF THE DISCLOSURE

The present disclosure generally relates to electronic devices and systems and, more particularly, to switch drivers.

BACKGROUND

In electronic instrumentation and signal processing, a switch driver is a device that controls a switch. For example, a sample-and-hold analog-to-digital converter (ADC) includes a plurality of switches and a plurality of switch drivers configured to control different switches. A switch driver may be described as "boosted" when an output voltage swing of the driver may go beyond the core supply rails in a given circuit. For example, boosted switch drivers may be used in radio frequency (RF) sampling ADCs to control switches with high gate voltages while being able to handle large signal swings.

A variety of factors can affect the cost, quality and robustness of a boosted switch driver. Physical constraints such as space/surface area can pose further constraints to the boosted switch driver requirements or specifications, and thus trade-off and ingenuity have to be exercised in designing a boosted switch driver that is optimal for a given application. Designing boosted switch drivers for high-speed signal switching (for example, for RF ADCs) is particularly challenging.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
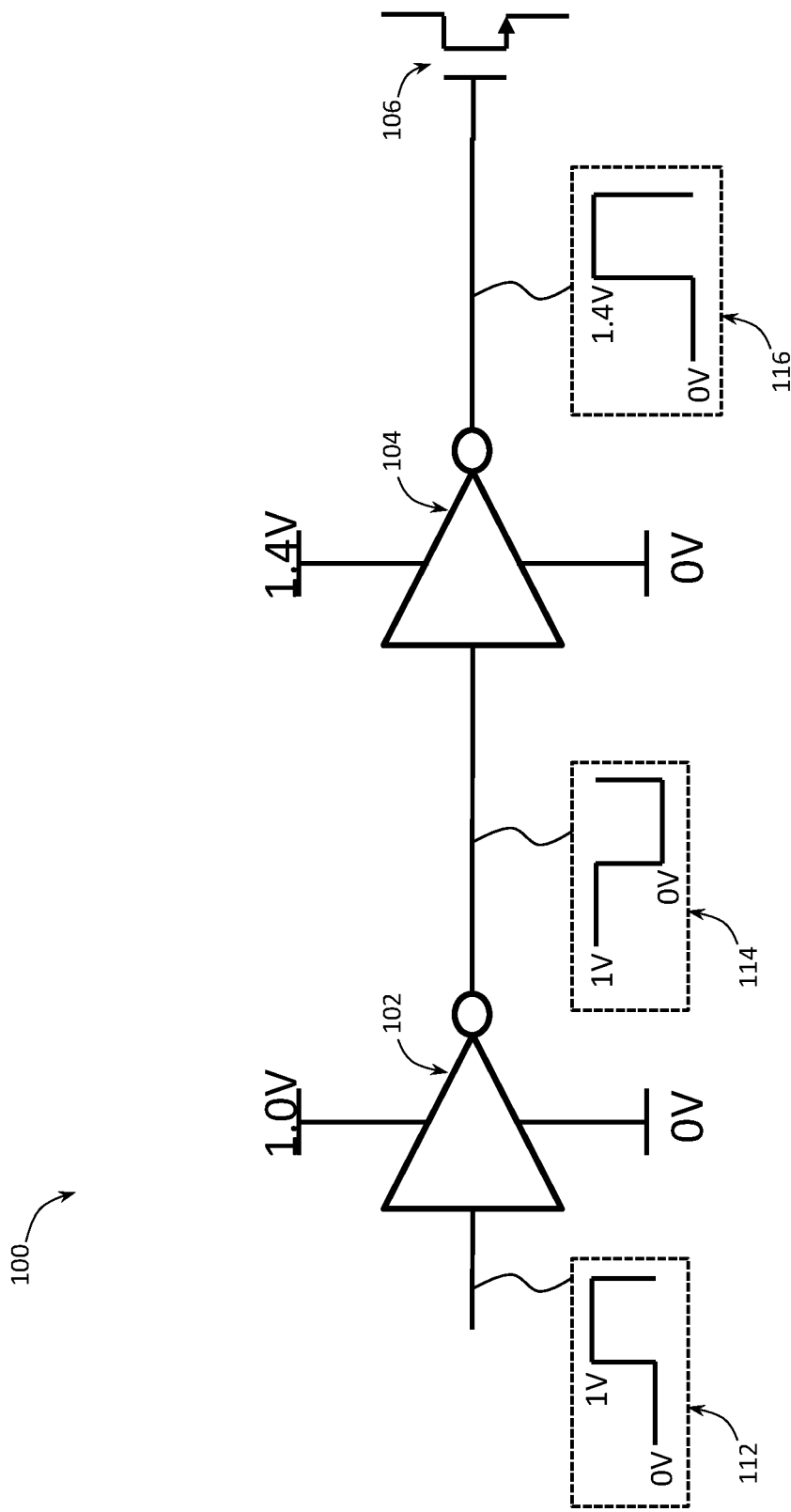
FIG. 1 provides an electric circuit diagram of an example circuit in which a boosted switch driver with level shifting in the branch of a P-type transistor may be used, according to some embodiments of the present disclosure.

The systems, methods and devices of this disclosure each have several innovative aspects, no single one of which is solely responsible for all of the desirable attributes disclosed herein. Details of one or more implementations of the subject matter described in the present disclosure are set forth in the description below and the accompanying drawings.

Embodiments of the present disclosure relate to switch driver circuits, and to devices and systems in which such circuits may be implemented. In one aspect of the present disclosure, an example switch driver circuit includes two branches. The first branch includes a first transistor (e.g., transistor m5 shown in the present drawings). The second branch includes a second transistor (e.g., transistor m6 shown in the present drawings) and a level shifter circuit. One of these transistors is an N-type transistor and the other one is a P-type transistor. The circuit is configured to split an input clock signal between the first branch and the second branch, so that a portion of the input clock signal split to the first branch is provided to the first transistor, and a portion of the input clock signal split to the second branch is level-shifted by the level shifter circuit to generate a level-shifted input clock signal and the level-shifted input clock signal is provided to the second transistor. In the context where the input clock signal has a low voltage value and a high voltage value, level-shifting of the input clock signal includes the level shifter circuit changing each of the low voltage value and the high voltage value of the input signal to generate the level-shifted input signal. The switch driver circuit is further configured to combine an output of the first transistor and an output of the second transistor to generate an output clock signal. Various embodiments of such a circuit are described in the following as "boosted switch driver circuits" (or, simply, "boosted switch drivers") because they may allow providing an output voltage swing that goes beyond the core supply rails. Boosted switch drivers described herein may advantageously allow providing very fast boosted edges where additional swing is needed for high-speed signal processing, which may help maximizing both clocking speed and dynamic range. Other aspects of the present disclosure provide systems, e.g., RF transceivers, that may include one or more boosted switch drivers as described herein, as well as methods for providing such boosted switch drivers.

The exact design of boosted switch drivers described herein may be realized in many different ways, all of which being within the scope of the present disclosure.

In one example of design variations according to various embodiments of the present disclosure, a choice can be made, individually for each of the transistors of boosted switch drivers according to any of the embodiments described herein, to employ bipolar transistors (e.g., where various transistors may be NPN or PNP transistors), field-effect transistors (FETs), e.g., metal-oxide-semiconductor (MOS) technology transistors (e.g., where various transistors may be N-type MOS (NMOS) or P-type MOS (PMOS) transistors), or a combination of one or more FETs and one or more bipolar transistors, as long as one of the transistors of the first and second branches of a boosted switch driver circuit is an N-type transistor (e.g., an NPN transistor if the transistor is a bipolar transistor or an NMOS transistor if the transistor is a FET) and the other one is a P-type transistor (e.g., a PNP transistor if the transistor is a bipolar transistor or a PMOS transistor if the transistor is a FET). In the present drawings, transistors are illustrated as FETs and the descriptions refer, therefore, to their terminals as gate, drain, and source terminals. However, in further embodiments of the present disclosure, any of the FETs illustrated in the drawings could be replaced with corresponding bipolar transistors. Therefore, descriptions provided below with reference to a "gate terminal" may be seen as referring to a "first terminal" where the term "first terminal" of a transistor is used to refer to a gate terminal if the transistor is a FET or to a base terminal if the transistor is a bipolar transistor. Similarly, descriptions provided below with reference to a "drain terminal" may be seen as referring to a "second terminal" where the term "second terminal" of a transistor is used to refer to a drain terminal if the transistor is a FET or to a collector terminal if the transistor is a bipolar transistor, and descriptions provided below with reference to a "source terminal" may be seen as referring to a "third terminal" where the term "third terminal" of a transistor is used to refer to a source terminal if the transistor is a FET or to an emitter terminal if the transistor is a bipolar transistor. These terms remain the same irrespective of whether a transistor of a given technology is an N-type transistor or a P-type transistor.

In another example, in various embodiments, a choice can be made, individually for each of the transistors of any of the boosted switch drivers as described herein, as to what type of transistor architecture to employ. For example, any of the transistors of the boosted switch drivers as described herein that are implemented as FETs may be planar transistors or may be non-planar transistors (some examples of the latter including FinFETs, nanowire transistors, and nanoribbon transistors).

As will be appreciated by one skilled in the art, aspects of the present disclosure, in particular aspects of boosted switch drivers as proposed herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g., to the existing RF ADCs, transceivers, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the select examples.

In the following description, reference is made to the drawings, where like reference numerals can indicate identical or functionally similar elements. It will be understood that elements illustrated in the drawings are not necessarily drawn to scale. Moreover, some embodiments can incorporate any suitable combination of features from two or more drawings. Further, it will be understood that certain embodiments can include more elements than illustrated in a drawing and/or a subset of the elements illustrated in a drawing. In general, while some drawings provided herein illustrate various aspects of boosted switch drivers, and systems in which such circuits may be implemented, details of these systems may be different in different embodiments. For example, various components of boosted switch drivers, presented herein, may have further components included therein, or coupled thereto, which are not specifically shown in the drawings, such as logic, storage, passive elements (e.g., resistors, capacitors, inductors, etc.), or other elements (e.g., transistors, etc.). In another example, details shown in some of the drawings, such as the particular arrangement and example implementation details of various components of boosted switch drivers presented herein (e.g., details of a level shifter circuit) and/or the particular arrangement of coupling connections may be different in different embodiments, with the illustrations of the present drawings providing only some examples of how these components may be used together to realize boosted switch drivers. In yet another example, although some embodiments shown in the present drawings illustrate a certain number of components (e.g., a certain number of level shifter circuits in a boosted switch driver), it is understood that these embodiments may be implemented in a boosted switch driver or in any other devices or systems with any number of these components in accordance with the descriptions provided herein. Furthermore, although certain elements such as various elements of boosted switch drivers presented herein may be depicted in the drawings as communicatively coupled using a single depicted line, in some embodiments, any of these elements may be coupled by a plurality of conductive lines such as those that may be present in a bus, or when differential signals are involved.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect electrical connection through one or more passive or active intermediary devices/components. In another example, the terms "circuit" or "circuitry" (which may be used interchangeably) refer to one or more passive and/or active components that are arranged to cooperate with one another to provide a desired function. Sometimes, in the present descriptions, the term "circuit" may be omitted (e.g., a boosted switch driver circuit may be referred to simply as a "boosted switch driver," a level shifter circuit may be referred to simply as a "level shifter," etc.). If used, the terms "substantially," "approximately," "about," etc., may be used to generally refer to being within +/−20% of a target value, e.g., within +/−10% of a target value, based on the context of a particular value as described herein or as known in the art.

Boosted Switch Driver Circuits with Two Branches and Level Shifting in One Branch All embodiments of boosted switch drivers proposed herein are based on splitting an input signal to a boosted switch driver circuit between two branches and then combining the outputs of the two branches to generate an output signal from the boosted switch driver circuit. Furthermore, all embodiments include a level shifter circuit in at least one of the branches, which allows the output signal from the boosted switch driver circuits to have a larger signal swing than the input signal and to have careful control over the maximum/high signal level of the output signal, over the minimum/low signal level, or both. One of the branches includes a P-type transistor and the other branch includes an N-type transistor. When only one of the branches includes a level shifter circuit, embodiments of boosted switch drivers proposed herein may be generally divided into a group of embodiments with level shifting on the side of (i.e., in the branch that includes) the P-type transistor (as illustrated in FIGS. 1-6) and a group of embodiments with level shifting on the side of (i.e., in the branch that includes) the N-type transistor (as illustrated in FIGS. 7-12). However, further embodiments are also possible and are within the scope of the present disclosure, where level shifting is performed both on the side of the P-type transistor and on the side of the N-type transistor. Such embodiments may be seen as a combination of the level shifting as described with reference to FIGS. 1-6 and level shifting as described with reference to FIGS. 7-12, all of which combinations being within the scope of the present disclosure.

Example Boosted Switch Driver Circuits with Level Shifting in the Branch of a P-Type Transistor FIG. 1 provides an electric circuit diagram of an example circuit 100 in which a boosted switch driver with level shifting in the branch of a P-type transistor may be used, according to some embodiments of the present disclosure. As shown in FIG. 1, the circuit 100 may include a series of a first inverter 102 and a second inverter 104, coupled to a switch 106. The first inverter 102 may be a fast inverter (e.g., a basic two-transistor inverter with one PMOS and one NMOS transistor, using core MOS transistors with the core supply voltage), configured to drive the second inverter 104, which may include any of the boost switch drivers with level shifting performed in the branch of a P-type transistor, described herein. The first inverter 102 may be configured to receive a digital signal having a sequence of voltage values, e.g., a clock signal, and provide an inverted version of that signal to the second inverter 104. For example, the digital signal provided to the first inverter 102 may be a sequence of voltage values between a low voltage value (e.g., 0 volts (V)) and a high voltage value (e.g., 1V), an example of which is shown in FIG. 1 as a signal 112 (schematically illustrated within a dashed block labeled "112"). The output of the first inverter 102 corresponding to such an input is shown in FIG. 1 as a signal 114 (schematically illustrated within a dashed block labeled "114"). Thus, the output swing of the first inverter 102 is 1V. The second inverter 104 may be a boosted switch driver with an elevated supply, i.e., configured to elevate/increase the output swing. This is shown in FIG. 1 with the second inverter 104 receiving a signal that has an output swing of 1V (i.e., the inset 114) and outputting an inverted and elevated version of that signal, shown in FIG. 1 as a signal 116 (schematically illustrated within a dashed block labeled "116"), still having a low voltage value of 0V but now having the high voltage value of 1.4V. The output of the second inverter 104 may then be used to drive the switch 106, which may, in some embodiments, be implemented as a transistor shown in FIG. 1.

In various embodiments, the inverter 104 may include any of the boosted switch driver circuits with level shifting in the branch of a P-type transistor, presented herein. In various embodiments, the signals 112, 114, 116 may be different, e.g., the signals may have different high and low values. Similarly, low and high supply voltages coupled to each of the inverter 102 and the inverter 104 may be different in different embodiments where any of the boosted switch driver circuits with level shifting in the branch of a P-type transistor, presented herein, are used to implement the inverter 104. Furthermore, in further embodiments, the inverter 104 that includes any of the boosted switch driver circuits with level shifting in the branch of a P-type transistor, presented herein, may be included in circuits other than the circuit 100 and, in particular, may but does not have to be implemented together with the inverter 102 as shown in FIG. 1.

Figure 2:
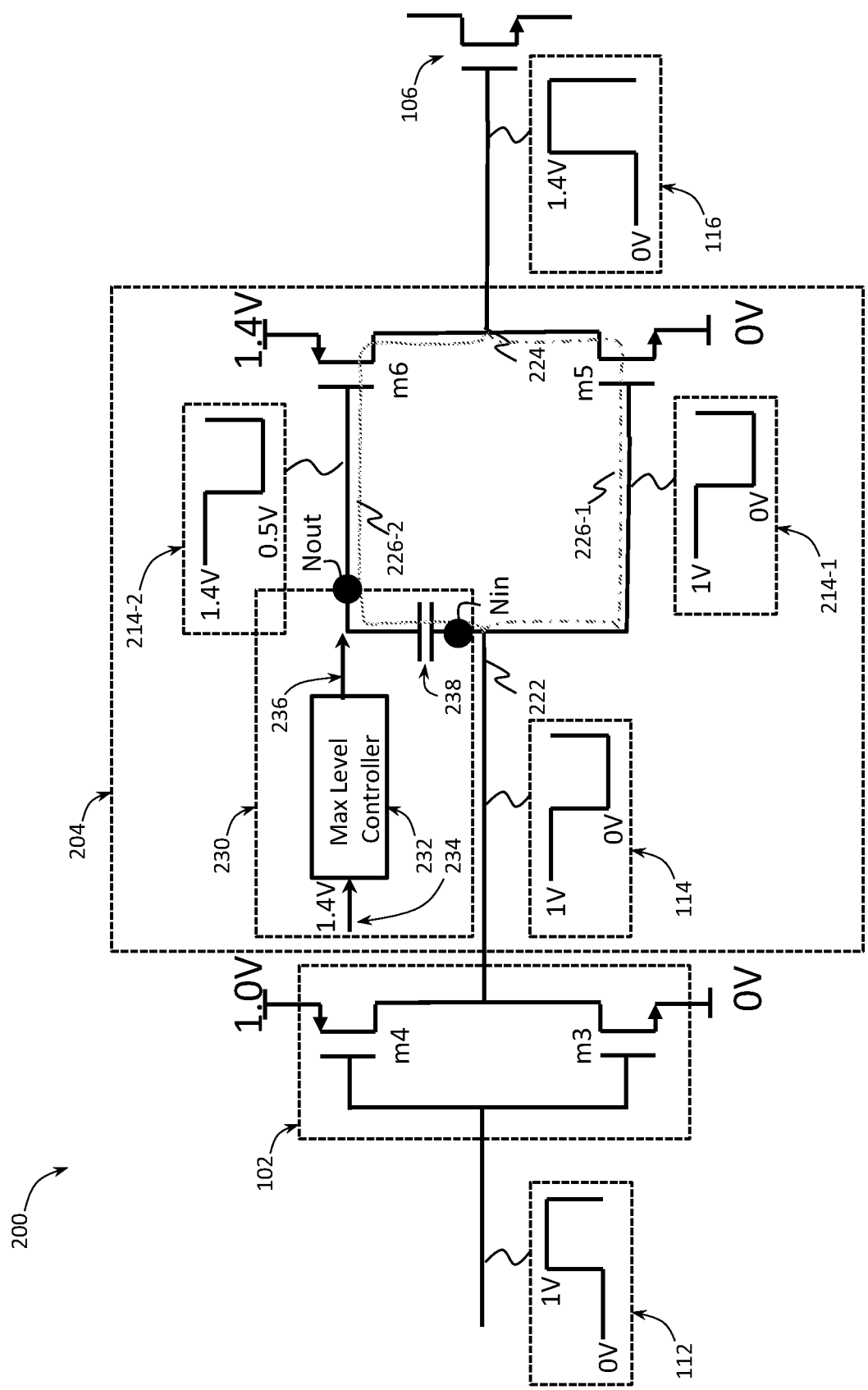
FIG. 2 provides an electric circuit diagram of an example circuit with a boosted switch driver with level shifting in the branch of the P-type transistor, according to some embodiments of the present disclosure.

FIG. 2 provides an electric circuit diagram of an example circuit 200 with a boosted switch driver with level shifting on the side of the P-type transistor, according to some embodiments of the present disclosure. The circuit 200 may be seen as an example of the circuit 100, where reference numerals that were used for the circuit 100 of FIG. 1 are used to refer to the same or functionally analogous elements as those shown for the circuit 200 of FIG. 2, so that descriptions of these elements provided with respect to one figure are not repeated for the other figure and only the differences are described (the same holds for other figures of the present disclosure).

As shown in FIG. 2, in some embodiments, the first inverter 102 may be implemented as a pair of complementary transistors m3, m4 (i.e., one of the transistors is an N-type and another one is a P-type). For example, the gate terminal of the transistor m3 may be coupled to the gate terminal of the transistor m4 and both may be coupled to the input clock signal 112, the drain terminal of the transistor m3 may be coupled to the drain terminal of the transistor m4 and both may be coupled to the output 114, and the source terminals of the transistors m3 and m4 may be coupled to the low and high supply voltages for the first inverter 102. For example, the transistor m3 may be an N-type transistor (e.g., an NMOS transistor, as illustrated in FIG. 2 with a corresponding electric circuit diagram representation for the transistor m3), having its source terminal coupled to the low supply voltage (e.g., 0V), and the transistor m4 may be a P-type transistor (e.g., a PMOS transistor, as illustrated in FIG. 2 with a corresponding electric circuit diagram representation for the transistor m4), having its source terminal coupled to the high supply voltage (e.g., 1V). As described above, the output clock signal 114 of the first inverter 102 may serve as a basis for an input clock signal to the second inverter 104.

FIG. 2 further illustrates a boosted switch driver circuit 204 that may, e.g., be an example of the second inverter 104 described above. As shown in FIG. 2, the circuit 204 may include an input 222, an output 224, and two branches 226 between the input 222 and the output 224. The first branch, schematically indicated in FIG. 2 with a dashed-dotted line 226-1, may include a transistor m5. The second branch, schematically indicated in FIG. 2 with a dotted line 226-2, may include a transistor m6 and a level shifter circuit 230. One of the transistors m5 and m6 may be an N-type transistor and the other one—a P-type transistor. Because FIG. 2 illustrates an embodiment with level shifting done on the side of the P-type transistor, the transistor m6 is the P-type transistor (e.g., a PMOS transistor, as illustrated in FIG. 2 with a corresponding electric circuit diagram representation for the transistor m6), having its source terminal coupled to the high supply voltage (e.g., 1.4V), while the transistor m5 is an N-type transistor (e.g., an NMOS transistor, as illustrated in FIG. 2 with a corresponding electric circuit diagram representation for the transistor m5). The circuit 204 may be configured to split an input clock signal, e.g., the signal 114, between the first branch 226-1 and the second branch 226-2, so that a portion of the input clock signal 114 split to the first branch 226-1 is provided to the transistor m5 of that branch and a portion of the input clock signal split to the second branch 226-2 is level-shifted by the level shifter circuit 230 to generate a level-shifted signal 214-2 and the level-shifted signal 214-2 is provided to the transistor m6. FIG. 2 illustrates a signal 214-1 being provided to the transistor m5 (namely, to the gate terminal of the transistor m5), and a signal 214-2 being provided to the transistor m6 (namely, to the gate terminal of the transistor m6). The signal 214-1 may be substantially the same as the signal 114 in terms of its voltage swing (e.g., from about 0 to about 1V, as shown for the example of FIG. 2), while the signal 214-2 may be a level-shifted signal compared to the signal 114, having a voltage swing from about 0.5V to about 1.4V. The circuit 204 is further configured to combine an output of the transistor m5 (e.g., an output from the drain terminal of the transistor m5) and an output of the transistor m6 (e.g., an output from the drain terminal of the transistor m6) to generate the output clock signal 116. Thus, the gate terminal of each of the transistors m5 and m6 may be coupled to the input 222, except that the gate terminal of the transistor m6 is coupled to the input 222 via the level shifter circuit 230, configured to perform level-shifting prior to providing the signal to the transistor m6. Similarly, the drain terminal of each of the transistors m5 and m6 may be coupled to the output 224, which may be coupled to the switch 106 to be driven by the switch driver circuit 204.

In some embodiments, the level shifter circuit 230 may include a voltage controller circuit 232 that may be configured to receive a reference signal 234 as an input and generate an output 236, as shown in FIG. 2. Furthermore, the level shifter circuit 230 may further include a coupling capacitor 238, coupled to the voltage controller circuit 232. For example, the first capacitor electrode of the coupling capacitor 238 may be coupled to the input 222, while the second capacitor electrode of the coupling capacitor 238 may be coupled to each of the voltage controller circuit 232 and the gate terminal of the transistor m6. In other words, a portion of the input clock signal 114 split to the second branch 226-2 of the circuit 204 may be configured to be applied to the first capacitor electrode of the coupling capacitor 238, while the second capacitor electrode of the coupling capacitor 238 may be coupled to each of the output 236 of the voltage controller circuit 232 and to the gate terminal of the transistor m6. The input 234 to the voltage controller circuit 232 may be a reference voltage or any other control signal configured to control the maximum voltage level set by the voltage controller circuit 232. The output 236 from the voltage controller circuit 232 may form basis for the level-shifted input clock signal 214-2 to be provided to the gate terminal of the transistor m6.

When the transistor m6 is a P-type transistor, as shown in the embodiment of FIG. 2, the voltage controller circuit 232 may be configured to control the maximum voltage value of the level-shifted input clock signal 214-2 provided to the transistor m6 and, consequently, in the output signal 116. To this end, the input to the NMOS transistor m5 may come directly from the 1V domain inverter output 114 (swings 0V to 1V), as the input 214-1 as shown in FIG. 2, while the input to the PMOS transistor m6 may be level-shifted via the coupling capacitor 238 with the voltage controller circuit 232 to provide a maximum switching voltage of, for example, 1.4V and a minimum switching voltage of, ideally, 1.4V−1V=0.4V. Due to capacitor charge redistribution, the capacitor coupled signal swing at the output Nout of the level shifter circuit 230 may be attenuated by the ratio related to the size of the coupling capacitor 238 to the size of capacitance on the gate of the PMOS transistor m6 plus routing parasitic capacitance. With that, the signal at the output Nout of the level shifter circuit 230 may swing from 1.4V to 1.4V-0.9V=0.5V (instead of the ideal 0.4V that would result in the preservation of 1V swing from the input Nin of the level shifter circuit 230 to the output Nout of the level shifter circuit 230), as is shown with the signal 214-2 illustrated in FIG. 2. The voltage controller circuit 232 or the level shifter circuit 230 as shown in FIG. 2 may be referred to as a "max level controller" because it is configured to set the maximum voltage value of the level-shifted input clock signal 214-2. The minimum voltage value of the level-shifted input clock signal 214-2 may then be adjusted automatically based on a ratio between the capacitance of the coupling capacitor 238 and the capacitance of the load for the voltage controller circuit 232.

Figure 6:
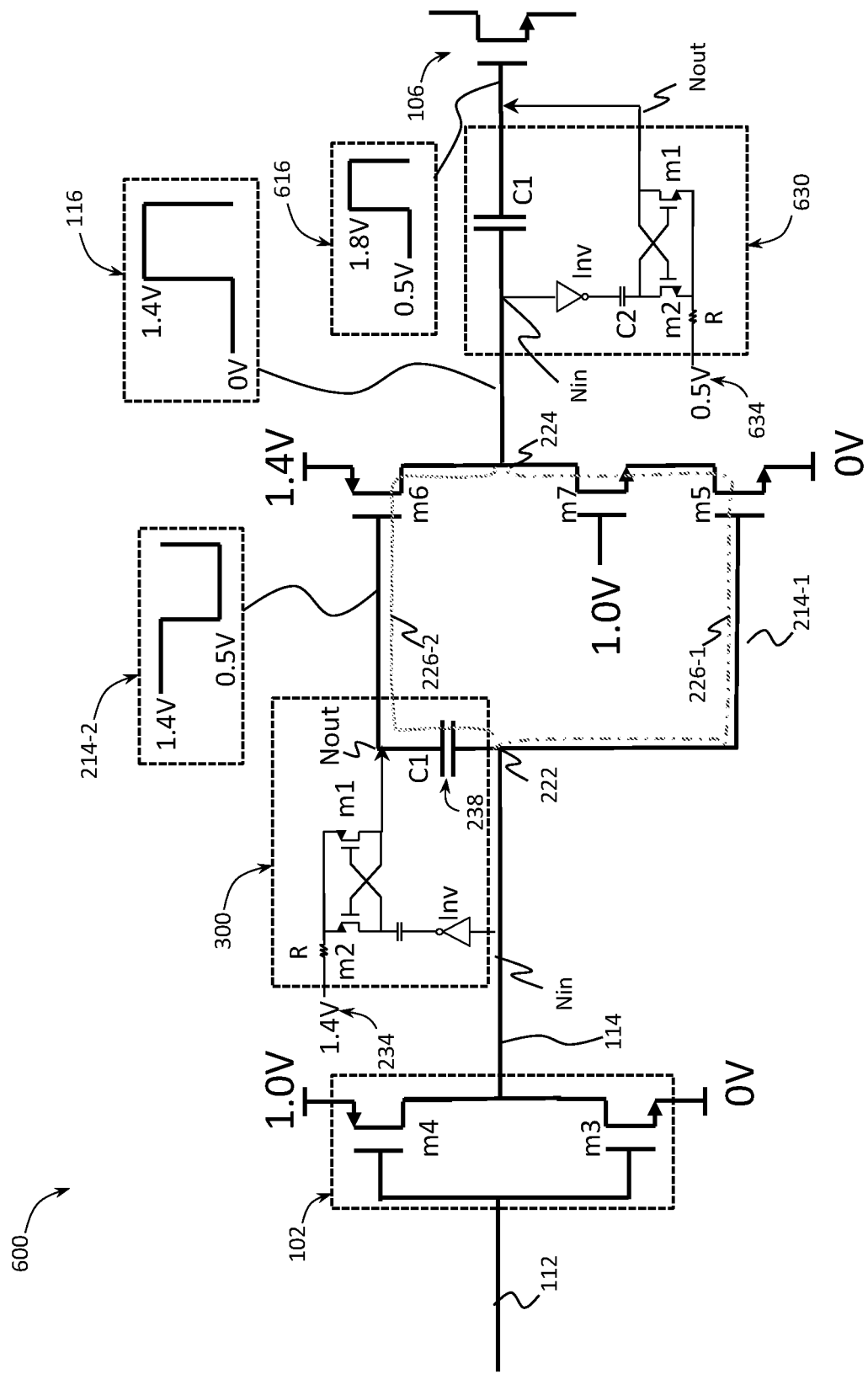
FIG. 6 provides an electric circuit diagram of an example circuit with a boosted switch driver with level shifting in the branch of the P-type transistor and with an additional level shifter configured to control the minimum/low signal level, according to some embodiments of the present disclosure.

In some embodiments of the level shifter circuit coupled to the P-type transistor of the boosted switch driver circuit (e.g., as shown in FIG. 2), the high supply voltage coupled to the source terminal of the P-type transistor (i.e., transistor m6 in this case) may be substantially the same as the maximum voltage value controlled by the voltage controller circuit 232 (e.g., both may be 1.4V), although in other embodiments these voltages may be different. In general, the value of the supply voltage coupled to the source terminal of the P-type transistor of the branch which also includes the max level controller (i.e., of the transistor m6 in this case) may correspond to (e.g., be substantially equal to) the high voltage in the level-shifted input clock signal 214-2. In some embodiments of the circuit 204, the low supply voltage coupled to the source terminal of the N-type transistor of the branch that does not include a level shifter circuit (i.e. of the transistor m5 in this case) may be substantially the same as the minimum voltage value in the output signal 116 (e.g., both may be 0V), although in other embodiments these voltages may be different (e.g., in case the second level shifter circuit is included, e.g., as shown in FIG. 6).

Figure 3:
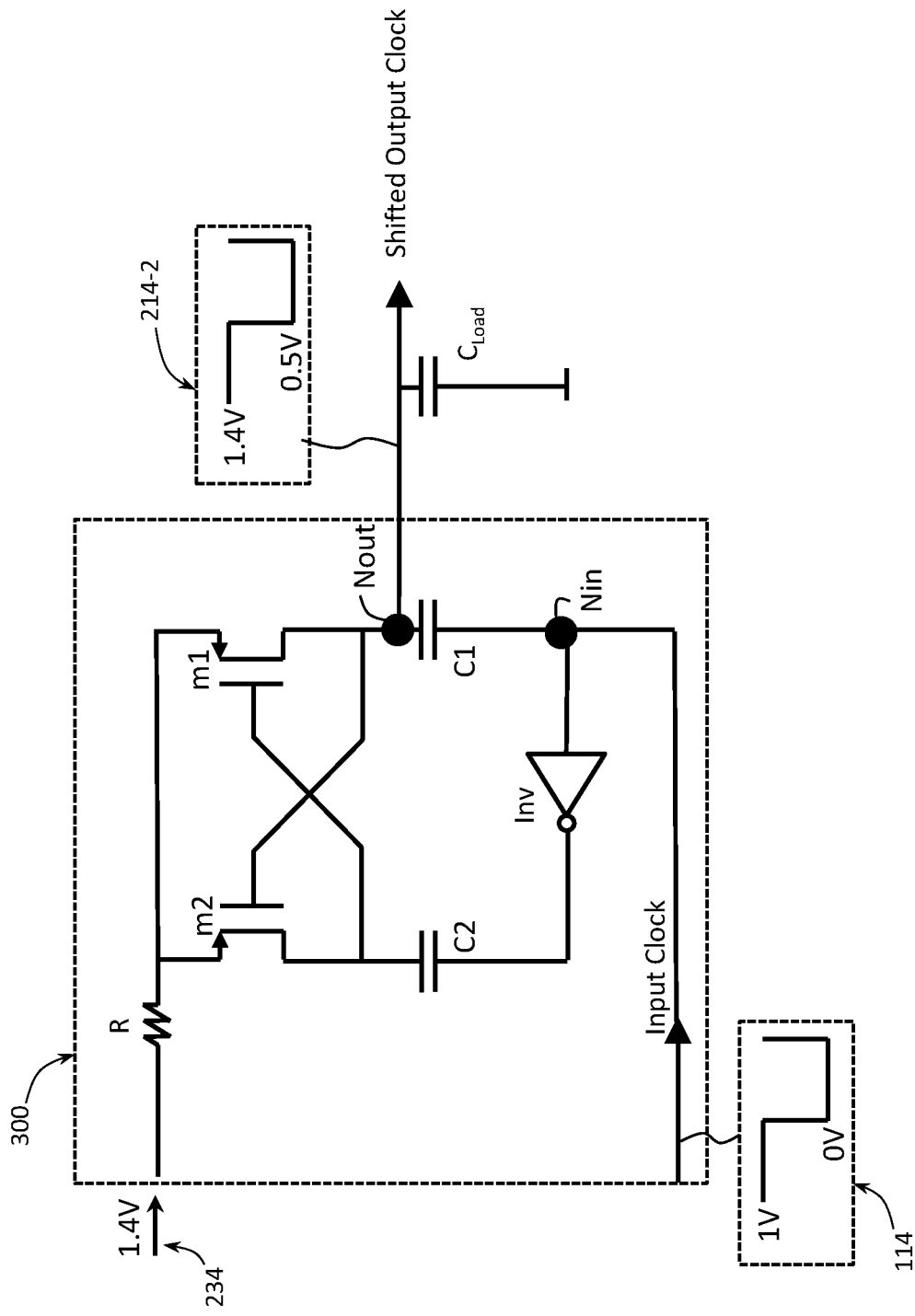
FIG. 3 provides an electric circuit diagram of an example level shifter circuit configured to perform level-shifting with controlling the maximum/high signal level, according to some embodiments of the present disclosure.

In various embodiments, the level shifter circuit 230 may be implemented in any manner that allows careful control of the maximum value of the level-shifted input clock signal 214-2 to be provided to the P-type transistor m6. One example is shown in FIG. 3, however, in other embodiments of the circuit 204, the level shifter circuit 230 may be implemented differently. FIG. 3 provides an electric circuit diagram of an example level shifter circuit 300 that may be used with/in a boosted switch driver, e.g., as the level shifter circuit 230 of the boosted switch driver 204 to perform level-shifting with controlling the maximum/high signal level, according to some embodiments of the present disclosure.

As shown in FIG. 3, the level shifter circuit 300 may include a pair of cross-coupled transistors m1 and m2. The transistors m1 and m2 are cross-coupled because the gate terminal of the transistor m1 is coupled to the drain terminal of the transistor m2 and the gate terminal of the transistor m2 is coupled to the drain terminal of the transistor m1. The source terminal of each of the transistors m1 and m2 is coupled to the reference voltage 234, provided to the level shifter circuit 300 to control the maximum voltage level set by the level shifter circuit 300. When the level shifter circuit 300 is a max level controller, which is the embodiment shown in FIG. 3, the transistors m1 and m2 may be P-type transistors, e.g., PMOS transistors as illustrated in FIG. 3 and the subsequent drawings of the max level controller. Furthermore, when the level shifter circuit 300 is a max level controller, the value of the reference voltage 234 may be configured to correspond to the high voltage of the level-shifted input clock signal 214-2 output by the circuit. In some embodiments, the reference voltage 234 may be substantially the same as the supply voltage to which the source terminal of the transistor m6 is coupled (e.g., both may be about 1.4V for the example shown in FIGS. 2 and 3), and may come from the same voltage source.

As further shown in FIG. 3, the level shifter circuit 300 may also include a pair of capacitors C1 and C2, and an inverter Inv coupled between the capacitors, e.g., by having an input of the inverter Inv coupled to a first capacitor electrode of the capacitor C1 and having an output of the inverter Inv coupled to a first capacitor electrode of the capacitor C2. The second capacitor electrode of the capacitor C1 may be coupled to the drain terminal of the transistor m1, while the second capacitor electrode of the capacitor C2 may be coupled to the drain terminal of the transistor m2. The input to the level shifter circuit 300 may be applied/provided to a node Nin, coupled to the first capacitor electrode of the capacitor C1 and the input to the inverter Inv, as shown in FIG. 3, and may be the input signal 114. The level shifter circuit 300 may generate an output signal from an output node Nout, coupled to one or more of the second capacitor electrode of the capacitor C1, the drain terminal of the transistor m1, and the gate terminal of the transistor m2. The output signal from the output node Nout may be the level-shifted input clock signal 214-2 as described above and may drive a load (represented in FIG. 3 by a capacitor $C_{load}$) coupled to the output node Nout.

Because the level shifter circuit 300 is a max level controller, the reference voltage 234 applied to the source terminals of the transistors m1 and m2 may accurately control the maximum/high level of the output voltage of the signal 214-2 (e.g., make sure that level is about 1.4V). The minimum/low level of the output voltage of the signal 214-2 may then be established based on the capacitor charge redistribution between the capacitor C1 and the load capacitance $C_{load}$, which is based on the ratio of these capacitances. Thus, the voltage swing of the output signal 214-2 may be based on the value of the reference voltage 234 provided to the level shifter circuit 300 and based on the capacitor charge redistribution between the capacitor C1 and the load capacitance $C_{load}$.

Figure 4:
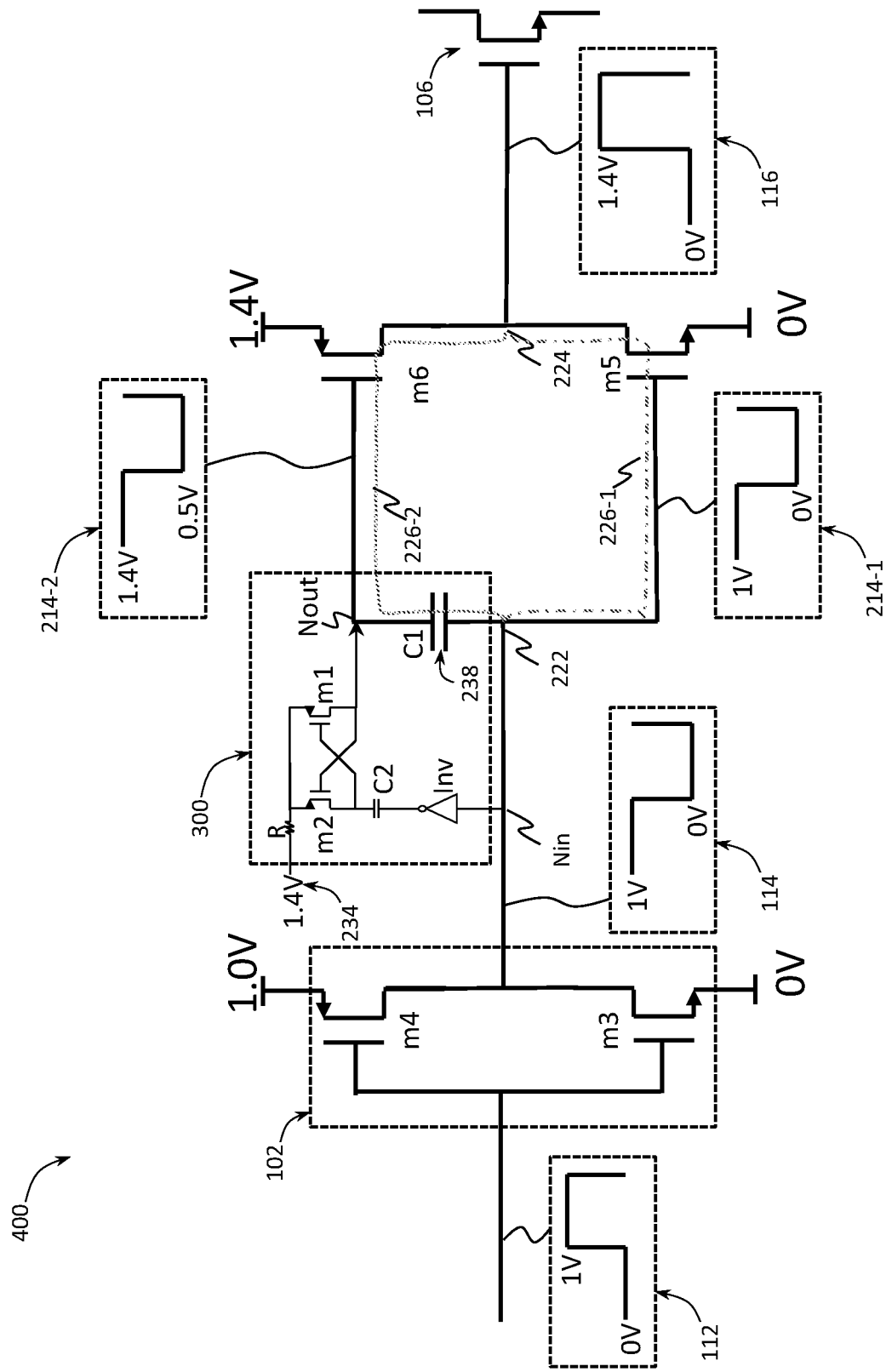
FIG. 4 provides an electric circuit diagram of an example circuit with a boosted switch driver with level shifting in the branch of the P-type transistor implemented using the level shifter circuit of FIG. 3, according to some embodiments of the present disclosure.

FIG. 4 provides an electric circuit diagram of an example circuit 400 with a boosted switch driver with level shifting on the side of the transistor m6 implemented using the level shifter circuit 300 of FIG. 3, according to some embodiments of the present disclosure. The circuit 400 may be seen as an example of the circuit 200 where the level shifter circuit 230 is implemented as and, therefore, replaced by (in the schematic illustration of FIG. 4), the level shifter circuit 300. In FIG. 4, reference numerals that were used for the circuits of FIGS. 1-3 are used to refer to the same or functionally analogous elements as those shown in FIGS. 1-3, so that their descriptions are not repeated for FIG. 4. Furthermore, various components of the level shifter circuit 300 shown in FIG. 3 and described above, such as the transistors m1 and m2, capacitors C1 and C2, and the inverter Inv, are also shown in FIG. 4 to make clear how the level shifter circuit 300 replaces the level shifter circuit 230 that was shown in FIG. 2 for this embodiment. It should be noted that in the embodiment of FIG. 4 the coupling capacitor 238 of the level shifter circuit 230 is realized by the capacitor C1 of the level shifter circuit 300. Input and output nodes Nin and Nout of the level shifter circuit 300 are also shown in FIG. 4 in context of the circuit 400.

Figure 5:
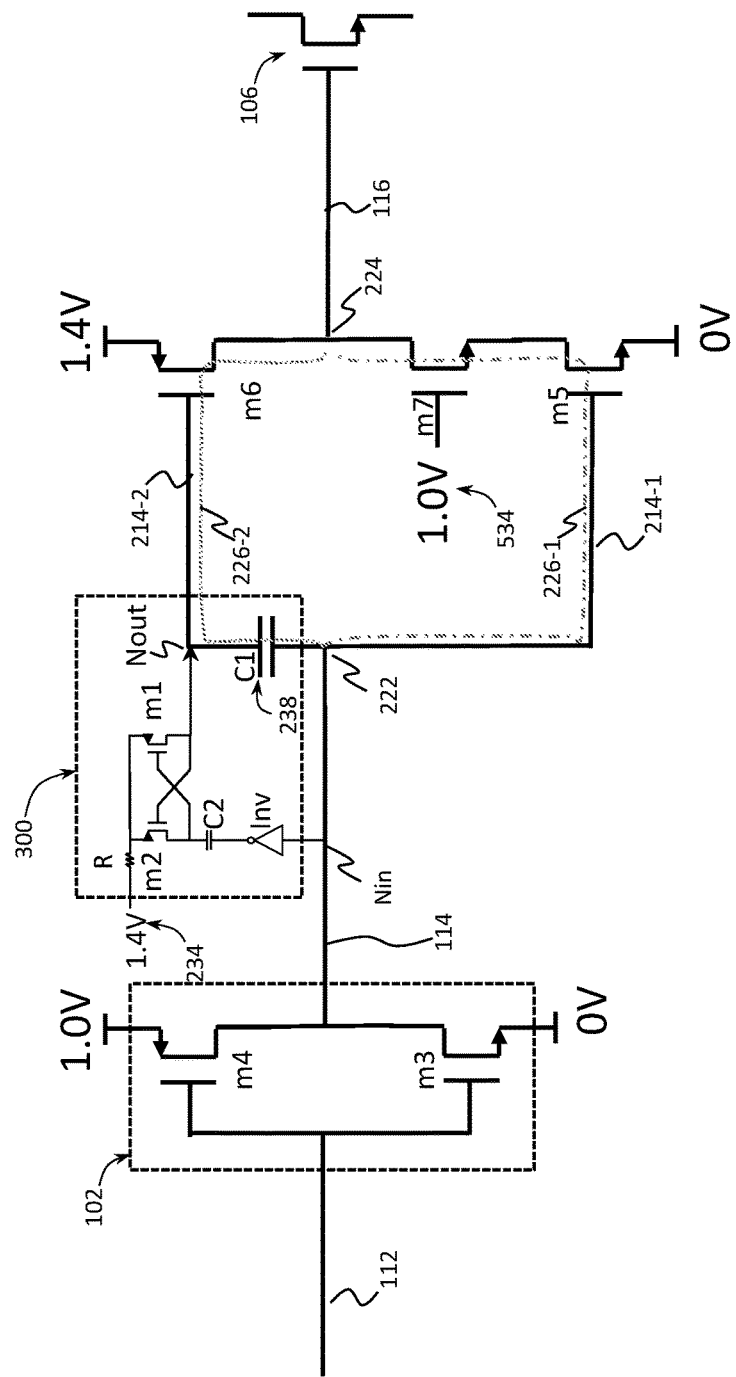
FIG. 5 provides an electric circuit diagram of an example circuit with a boosted switch driver with level shifting in the branch of the P-type transistor and with an additional transistor provided as a cascode transistor to the N-type transistor, according to some embodiments of the present disclosure.

FIG. 5 provides an electric circuit diagram of an example circuit 500 with a boosted switch driver with level shifting in the branch of the P-type transistor (i.e., of the transistor m6 for the example shown) and with an additional transistor provided as a cascode transistor to the N-type transistor of the other branch (i.e., to the transistor m5 for the example shown), according to some embodiments of the present disclosure. The circuit 500 may be seen as a further embodiment of the circuit 400 where, similar to the circuit 400, the level shifter circuit 230 is implemented as and, therefore, replaced by, in the schematic illustration of FIG. 5, the level shifter circuit 300. In FIG. 5, reference numerals that were used for the circuits of FIGS. 1-4 are used to refer to the same or functionally analogous elements as those shown in FIGS. 1-4, so that their descriptions are not repeated for FIG. 5 and only the differences are described. The circuit 500 differs from the circuit 400 in that the circuit 500 further includes an additional transistor m7 provided as a cascode transistor to the transistor m5, described above. To that end, the transistors m5 and m7 may be transistors of the same type (e.g., both are N-type transistors, as is shown in the illustration of FIG. 5). The cascode transistor m7 may be seen as a part of the first branch 226-1. As shown in FIG. 5, the drain terminal of the transistor m5 may be coupled to the output 224 by having the drain terminal of the transistor m5 being coupled to the source terminal of the cascode transistor m7, and having the drain terminal of the cascode transistor m7 being coupled to the output 224. In various embodiments, the gate terminal (e.g., a gate terminal) of the cascode transistor m7 may be coupled to a suitable reference voltage 534. For example, the reference voltage 534 may be approximately 1V for the embodiments where the cascode transistor m7 is an N-type transistor as is the case shown (i.e., for the embodiments where the level shifter circuit included in the circuit 500 is a max level controller). However, in other embodiments, the value of the reference voltage 534 may be different.

Although only one cascode transistor m7 is shown in FIG. 5, in other embodiments of the circuit shown in FIG. 5, more than one cascode transistors m7 may be included in the first branch 226-1. While FIG. 5 illustrates the cascode transistor m7 in combination with the level shifter circuit 300 of FIG. 3, in further embodiments of the circuit 200 shown in FIG. 2, the first branch 226-1 of the circuit 200 may include at least one such cascode transistor m7, where the level shifter circuit 230 may, but does not have to, be implemented as the level shifter circuit 300. Furthermore, in any of the embodiments of a boosted switch driver with level shifting in the branch of the P-type transistor (e.g., any of the embodiments described with reference to FIGS. 1-6), one or more additional transistors m8 (not specifically shown in the drawings) may be provided as cascode transistors to the transistor m6 (i.e., as cascode transistors to the P-type transistor of the level shifter circuit). To that end, the transistors m6 and m8 may be transistors of the same type (e.g., both are P-type transistors), and the one or more cascode transistors m8 may be a part of the second branch 226-2. For example, the gate terminal of such a cascode transistor m8 may be coupled to a ground potential, the source terminal of the transistor m8 may be coupled to the drain terminal of the transistor m6, and the drain terminal of the cascode transistor m8 may be coupled to the output 224.

FIG. 6 provides an electric circuit diagram of an example circuit 600 with a boosted switch driver with level shifting in the branch of the P-type transistor and with an additional level shifter circuit configured to control the minimum/low level, according to some embodiments of the present disclosure. The circuit 600 may be seen as a further embodiment of the circuit 500 where, similar to the circuit 500, the level shifter circuit 230 is implemented as and, therefore, replaced by (in the schematic illustration of FIG. 6), the level shifter circuit 300. Also similar to the circuit 500, the circuit 600 further includes the cascode transistor m7. In FIG. 6, reference numerals that were used for the circuits of FIGS. 1-5 are used to refer to the same or functionally analogous elements as those shown in FIGS. 1-5, so that their descriptions are not repeated for FIG. 6 and only the differences are described. The circuit 600 differs from the circuit 500 in that the circuit 600 further includes an additional level shifter circuit 630, configured to control the minimum/low level of the output signal from the circuit 600. Thus, the circuit 630 may be referred to as a "min level controller."

In some embodiments, the additional level shifter circuit 630 may be implemented in a manner analogous to the level shifter circuit 300 except that the P-type transistors m1 and m2 of the level shifter circuit 300 are replaced by the N-type transistors in the level shifter circuit 630 in order to control the minimum/low level of the output signal from the level shifter circuit 630. A more detailed description of such a circuit is provided with reference to FIG. 9 (i.e., the additional level shifter circuit 630 may be implemented as the level shifter circuit 900, shown in FIG. 9).

As shown in FIG. 6, the level shifter circuit 630 may include a pair of cross-coupled transistors m1 and m2. The transistors m1 and m2 are cross-coupled because the gate terminal of the transistor m1 is coupled to the drain terminal of the transistor m2 and the gate terminal of the transistor m2 is coupled to the drain terminal of the transistor m1. The source terminal of each of the transistors m1 and m2 is coupled to a reference voltage 634, provided to the level shifter circuit 630 to control the minimum voltage level set by the level shifter circuit 630. When the level shifter circuit 630 is a min level controller, the transistors m1 and m2 may be N-type transistors, e.g., NMOS transistors as illustrated in FIG. 6 and the subsequent drawings of the min level controller. Furthermore, when the level shifter circuit 630 is a min level controller, the value of the reference voltage 634 may be configured to correspond to the low voltage in a level-shifted clock signal 616 output by the circuit 630.

As further shown in FIG. 6, the level shifter circuit 630 may also include a pair of capacitors C1 and C2, and an inverter Inv coupled between the capacitors, e.g., by having an input of the inverter Inv coupled to a first capacitor electrode of the capacitor C1 and having an output of the inverter Inv coupled to a first capacitor electrode of the capacitor C2. The second capacitor electrode of the capacitor C1 may be coupled to the switch 106 to be driven by the switch driver 600, while the second capacitor electrode of the capacitor C2 may be coupled to the drain terminal of the transistor m2 (and, correspondingly, to the gate terminal of the transistor m1 since the drain terminal of the transistor m2 is coupled to the gate terminal of the transistor m1).

The input to the level shifter circuit 630 may be applied/provided to a node Nin of the circuit 630, coupled to the first capacitor electrode of the capacitor C1 and, in some embodiments, to the input to the inverter Inv, as shown in FIG. 6. In some embodiments, the input to the level shifter circuit 630 may be based on the output signal 116 from the boosted switch driver circuit 204, i.e., on the signal from 0V to 1.4V for the example shown in FIG. 6. The level shifter circuit 630 may generate an output signal from an output node Nout of the circuit 630, coupled to one or more of the second capacitor electrode of the capacitor C1, the drain terminal of the transistor m1, and the gate terminal of the transistor m2. The output signal 616 from the output node Nout of the level shifter circuit 630 may be a level-shifted version of the input signal provided at the input node Nin (e.g., the signal 116) of the level shifter circuit 630 where the minimum/low value of the signal is carefully controlled based on the reference signal 634. For example, if the input signal provided at the input node Nin of the level shifter circuit 630 is the signal 116 as described above, having the minimum and the maximum voltage values of 0V and 1.4V, respectively, then the level shifter circuit 630 may shift these values by about 0.5V (i.e., the value of the reference voltage 634). In particular, the level shifter circuit 630 is configured to carefully control that the minimum voltage value is shifted by the value based on the reference voltage 634, i.e., that the minimum voltage value is shifted from 0V to 0.5V, for the example shown. Ideally, the maximum switching voltage would then be 1.4V+0.5V=1.9V. However, similar to the max voltage controller, due to capacitor charge redistribution, the capacitor coupled signal swing at the output Nout of the level shifter circuit 630 may be attenuated by the ratio related to the size of the coupling capacitor C1 of the level shifter circuit 630 to the size of capacitance on the gate of the transistor that may implement the switch 106 plus routing parasitic capacitance. With that, the signal at the output Nout of the level shifter circuit 630 may swing from 0.5V to 0.5V+1.3V=1.8V (instead of the ideal 1.9V that would result in the preservation of the 1.4V swing from the input Nin of the level shifter circuit 630 to the output Nout of the level shifter circuit 630), as is shown with the signal 616 illustrated in FIG. 6. Thus, the level shifter circuit 630 may carefully control, based on the reference signal 634, the minimum/low value of the level-shifted clock signal 616, while the maximum/high voltage value of the level-shifted clock signal 616 may then be adjusted automatically based on a ratio between the capacitance of the coupling capacitor C1 of the level shifter circuit 630 and the capacitance of the load for the level shifter circuit 630, including parasitic capacitance. In other words, since the level shifter circuit 630 is a min level controller, the reference voltage 634 applied to the source terminals of the transistors m1 and m2 of the level shifter circuit 630 may accurately control the minimum/low level of the output voltage of the signal 616 (e.g., make sure that level is about 0.5V). The maximum/high level of the output voltage of the signal 616 may then be established based on the capacitor charge redistribution between the capacitor C1 of the level shifter circuit 630 and the load capacitance $C_{load}$ for the level shifter circuit 630, which is based on the ratio of these capacitances. As a result, the voltage swing of the output signal 616 may be based on the value of the reference voltage 234 provided to the level shifter circuit 300, the value of the reference voltage 634 provided to the level shifter circuit 630, and the capacitor charge redistribution between the capacitor C1 of the level shifter circuit 630 and the load capacitance $C_{Load}$ of the level shifter circuit 630.

Although not specifically shown in FIG. 6, in other embodiments of the circuit 630, the input to the inverter Inv of the level shifter circuit 630 may be based on an inverted version of the input signal 114 that was provided to the input 222, as opposed to the output signal 116 from the output 224 as is shown in FIG. 6. In such embodiments, the inverter of the level shifter circuit 630 may be decoupled from the signal 116, but coupled to the inverted version of the signal 114 instead, which could be advantageous in cases when it may not be reliable to drive the inverter of the level shifter circuit 630 with a signal having a signal swing larger than about 1V. In such embodiments, one of the capacitor electrodes of the capacitor C1 of the level shifter circuit 630 is still driven by the signal 116 so that the level shifter circuit 630 may then generate an output signal, provided at the output node Nout of the level shifter circuit 630, as a level-shifted version of the signal 116 provided at the input node Nin of the level shifter circuit 630 where the minimum/low value of the signal is carefully controlled based on the reference signal 634.

FIG. 6 illustrates one manner of how the level shifter circuit 630 may be implemented to provide control of the minimum/low level of the output voltage of the signal 616 as described above. In other embodiments of the circuit 600, the level shifter circuit 630 may be implemented in any other manner than the one shown in FIG. 6, as long as it provides a sufficiently accurate control of the minimum/low level of the output voltage of the signal 616, with the maximum/high level being adjusted accordingly.

While FIG. 6 illustrates the additional level shifter circuit 630 in combination with the level shifter circuit 300 of FIG. 3, in further embodiments of the circuit 200 shown in FIG. 2, the additional level shifter circuit 630 may be included to receive the signal 116 as an input and to generate the output 616 as described with reference to FIG. 6 where the level shifter circuit 230 may, but does not have to be implemented as the level shifter circuit 300. Furthermore, while FIG. 6 illustrates the additional level shifter circuit 630 in combination with the cascode transistor m7 of FIG. 5, in further embodiments of the circuit 200 shown in FIG. 2, the additional level shifter circuit 630 may be included as described with reference to FIG. 6 without the cascode transistor m7. Still in further embodiments of the circuit 200 shown in FIG. 2, the additional level shifter circuit 630 may be included as described with reference to FIG. 6 without the cascode transistor m7 and where the level shifter circuit 230 is implemented differently from the level shifter circuit 300. In any of these embodiments, the level shifter circuit 630 may be implemented in any other manner than the one shown in FIG. 6, as long as it provides a sufficiently accurate control of the minimum/low level of the output voltage of the signal 616 as described above.

Still further, while FIG. 6 illustrates the level shifter circuit 630 configured to provide control of the minimum/low level of the output voltage of the signal 616 as described above, in other embodiments, the level shifter circuit 630 may be replaced with a level shifter circuit 630' (not shown in FIG. 6 but the reference numeral used here for the ease of the descriptions), configured to provide control of the maximum/high level of the output voltage of the signal 616. In some such embodiments, in order to realize the level shifter circuit 630', the level shifter circuit 630 shown in FIG. 6 may be replaced with another instance of the level shifter circuit 300, or, equivalently, the NMOS transistors of the level shifter circuit 630 shown in FIG. 6 may be replaced with PMOS transistors and the reference voltage 634 may be a replaced with a reference voltage 634' (also not shown in FIG. 6 but the reference numeral used here for the ease of the descriptions), configured to accurately control the maximum/high level of the output voltage of the signal 616.

The input to the level shifter circuit 630' may be applied/provided to a node Nin of the circuit 630', coupled to the first capacitor electrode of the capacitor C1 and, in some embodiments, to the input to the inverter Inv, as shown in FIG. 6. In some embodiments, the input to the level shifter circuit 630' may be based on the output signal 116 from the boosted switch driver circuit 204, i.e., on the signal from 0V to 1.4V for the example shown in FIG. 6. The level shifter circuit 630' may generate an output signal from an output node Nout of the circuit 630', coupled to one or more of the second capacitor electrode of the capacitor C1, the drain terminal of the transistor m1, and the gate terminal of the transistor m2. The output signal 616 from the output node Nout of the level shifter circuit 630' may be a level-shifted version of the input signal provided at the input node Nin (e.g., the signal 116) of the level shifter circuit 630' where the maximum/high value of the signal is carefully controlled based on the reference signal 634'. For example, if the input signal provided at the input node Nin of the level shifter circuit 630' is the signal 116 as described above, having the minimum and the maximum voltage values of 0V and 1.4V, respectively, then the level shifter circuit 630' may shift these values so that the maximum voltage value is 1.8V, which would be the value of the reference voltage 634' for such an example. In particular, the level shifter circuit 630' is configured to carefully control that the maximum voltage value is shifted by the value based on the reference voltage 634', i.e., that the maximum voltage value is shifted by 0.4V, from 1.4V to 1.8V, for the example shown. Ideally, the minimum switching voltage would then be 0V+0.4V=0.4V. However, as was described above for the max voltage controller 300, due to capacitor charge redistribution, the capacitor coupled signal swing at the output Nout of the level shifter circuit 630' may be attenuated by the ratio related to the size of the coupling capacitor C1 of the level shifter circuit 630' to the size of capacitance on the gate of the transistor that may implement the switch 106 plus routing parasitic capacitance. With that, the minimum voltage value at the output Nout of the level shifter circuit 630' may be 1.8V−1.3V=0.5V (instead of the ideal 0.4V that would have resulted in the preservation of the 1.4V swing from the input Nin of the level shifter circuit 630' to the output Nout of the level shifter circuit 630'), as is shown with the signal 616 illustrated in FIG. 6. Thus, the level shifter circuit 630' may carefully control, based on the reference signal 634', the maximum/high value of the level-shifted clock signal 616, while the minimum/low voltage value of the level-shifted clock signal 616 may then be adjusted automatically based on a ratio between the capacitance of the coupling capacitor C1 of the level shifter circuit 630' and the capacitance of the load for the level shifter circuit 630', including parasitic capacitance. In other words, since the level shifter circuit 630' is a max level controller, the reference voltage 634' applied to the source terminals of the transistors m1 and m2 of the level shifter circuit 630' may accurately control the maximum/high level of the output voltage of the signal 616 (e.g., make sure that level is about 1.8V). The minimum/low level of the output voltage of the signal 616 may then be established based on the capacitor charge redistribution between the capacitor C1 of the level shifter circuit 630' and the load capacitance $C_{load}$ for the level shifter circuit 630', which is based on the ratio of these capacitances. As a result, the voltage swing of the output signal 616 may be based on the value of the reference voltage 234 provided to the level shifter circuit 300, the value of the reference voltage 634' provided to the level shifter circuit 630', and the capacitor charge redistribution between the capacitor C1 of the level shifter circuit 630' and the load capacitance $C_{load}$ of the level shifter circuit 630'.

Similar to the variation for the level shifter circuit 630 shown in FIG. 6, described above, in other embodiments of the circuit 630', the input to the inverter Inv of the level shifter circuit 630' may be based on an inverted version of the input signal 114 that was provided to the input 222, as opposed to the output signal 116 from the output 224 as is shown in FIG. 6. In such embodiments, the inverter of the level shifter circuit 630' may be decoupled from the signal 116, but coupled to the inverted version of the signal 114 instead, which could be advantageous in cases when it may not be reliable to drive the inverter of the level shifter circuit 630' with a signal having a signal swing larger than about 1V. In such embodiments, one of the capacitor electrodes of the capacitor C1 of the level shifter circuit 630' is still driven by the signal 116 so that the level shifter circuit 630' may then generate an output signal, provided at the output node Nout of the level shifter circuit 630', as a level-shifted version of the signal 116 provided at the input node Nin of the level shifter circuit 630' where the maximum/high value of the signal is carefully controlled based on the reference signal 634'.

In other embodiments of the circuit 600, the level shifter circuit 630' may be implemented in any other manner than the level shifter circuit 300, as long as it provides a sufficiently accurate control of the maximum/high level of the output voltage of the signal 616, with the minimum/low level being adjusted accordingly.

Figure 7:
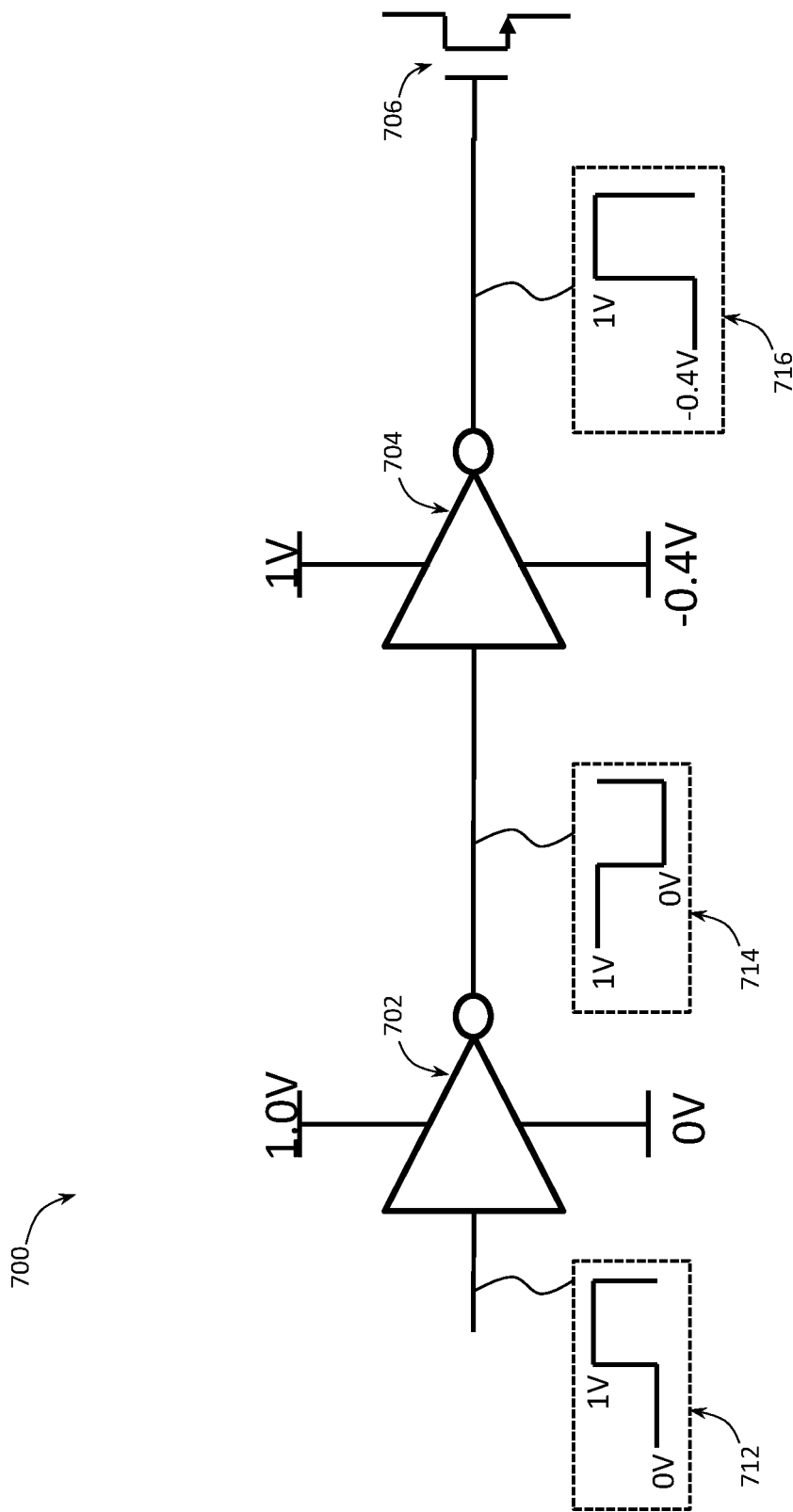
FIG. 7 provides an electric circuit diagram of an example circuit in which a boosted switch driver with level shifting in the branch of an N-type transistor may be used, according to some embodiments of the present disclosure.

Example Boosted Switch Driver Circuits with Level Shifting in the Branch of an N-Type Transistor FIG. 7 provides an electric circuit diagram of an example circuit 700 in which a boosted switch driver with level shifting in the branch of an N-type transistor may be used, according to some embodiments of the present disclosure. As shown in FIG. 7, the circuit 700 may include a series of a first inverter 702 and a second inverter 704, coupled to a switch 706. The first inverter 702 may be substantially analogous to the first inverter 102, configured to receive a signal 712 (analogous to the signal 112) as an input and generate a signal 714 (analogous to the signal 714) as an output. Descriptions provided above with reference to the inverter 102, the input signal 112, and the output signal 114 are applicable to, respectively, the inverter 702, the input signal 712, and the output signal 714, and, therefore, in the interests of brevity are not repeated.

The first inverter 704 may be configured to drive the second inverter 104, which may include any of the boost switch drivers with level shifting performed in the branch of an N-type transistor, described herein. The second inverter 704 may be a boosted switch driver with an elevated supply, i.e., configured to increase the output swing. This is shown in FIG. 7 with the second inverter 704 receiving a signal that has an output swing of 1V (i.e., the inset 714) and outputting a version of that signal that has been inverted and has a greater output swing, shown in FIG. 7 as a signal 716 (schematically illustrated within a dashed block labeled "716"), still having a high voltage value of 1V but now having the low voltage value of −0.4V. The output of the second inverter 704 may then be used to drive the switch 706, which may, in some embodiments, be implemented as a transistor shown in FIG. 7.

In various embodiments, the inverter 104 may include any of the boosted switch driver circuits with level shifting in the branch of an N-type transistor, presented herein. In various embodiments, the signals 712, 714, 716 may be different, e.g., the signals may have different high and low values. Similarly, low and high supply voltages coupled to each of the inverter 702 and the inverter 704 may be different in different embodiments where any of the boosted switch driver circuits with level shifting in the branch of an N-type transistor, presented herein, are used to implement the inverter 704. Furthermore, in further embodiments, the inverter 704 that includes any of the boosted switch driver circuits with level shifting in the branch of an N-type transistor, presented herein, may be included in circuits other than the circuit 700 and, in particular, may but does not have to be implemented together with the inverter 702 as shown in FIG. 7.

Figure 8:
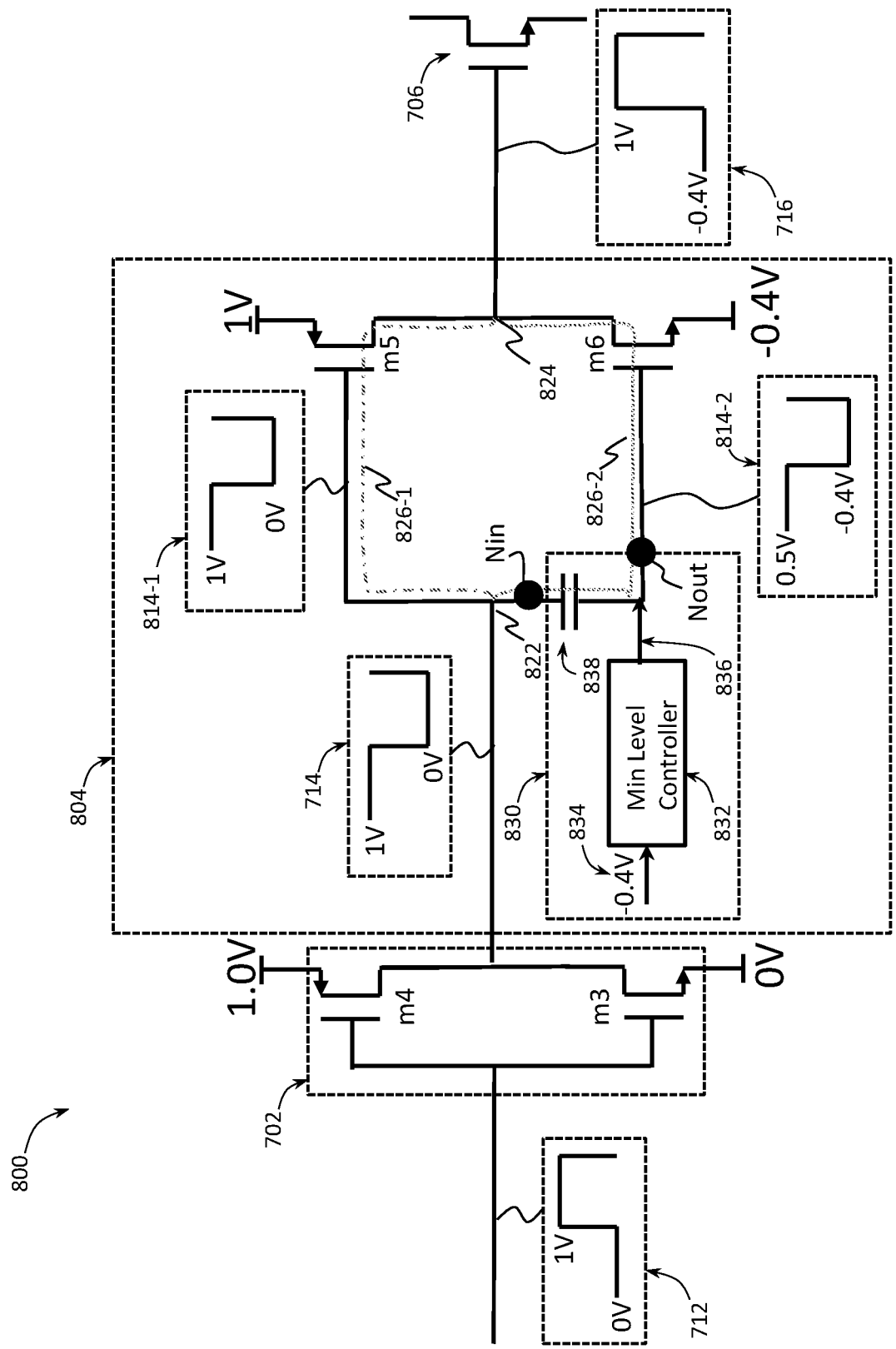
FIG. 8 provides an electric circuit diagram of an example circuit with a boosted switch driver with level shifting in the branch of the N-type transistor, according to some embodiments of the present disclosure.

FIG. 8 provides an electric circuit diagram of an example circuit 800 with a boosted switch driver with level shifting on the side of the N-type transistor, according to some embodiments of the present disclosure. The circuit 800 may be seen as an example of the circuit 700, where reference numerals that were used for the circuit 700 of FIG. 7 are used to refer to the same or functionally analogous elements as those shown for the circuit 800 of FIG. 8, so that descriptions of these elements provided with respect to one figure are not repeated for the other figure and only the differences are described.

As shown in FIG. 8, in some embodiments, the first inverter 702 may be implemented as a pair of complementary transistors m3, m4 (i.e., one of the transistors is an N-type and another one is a P-type), similar to the implementation of the first inverter 102 shown in FIG. 2, the descriptions of which are applicable to the first inverter 702 and, therefore, in the interests of brevity, are not repeated. The output clock signal 714 of the first inverter 702 may serve as a basis for an input clock signal to the second inverter 704.

FIG. 8 further illustrates a boosted switch driver circuit 804 that may, e.g., be an example of the second inverter 704 described above. As shown in FIG. 8, the circuit 804 may include an input 822, an output 824, and two branches 826 between the input 822 and the output 824. The first branch, schematically indicated in FIG. 8 with a dashed-dotted line 826-1, may include a transistor m5. The second branch, schematically indicated in FIG. 8 with a dotted line 826-2, may include a transistor m6 and a level shifter circuit 830. Again, one of the transistors m5 and m6 may be an N-type transistor and the other one—a P-type transistor. Because FIG. 8 illustrates an embodiment with level shifting done on the side of the N-type transistor, the transistor m6 is the N-type transistor (e.g., an NMOS transistor, as illustrated in FIG. 8 with a corresponding electric circuit diagram representation for the transistor m6), having its source terminal coupled to the low supply voltage (e.g., −0.4V), while the transistor m5 is a P-type transistor (e.g., a PMOS transistor, as illustrated in FIG. 8 with a corresponding electric circuit diagram representation for the transistor m5). The circuit 804 may be configured to split an input clock signal, e.g., the signal 714, between the first branch 826-1 and the second branch 826-2, so that a portion of the input clock signal 714 split to the first branch 826-1 is provided to the transistor m5 of that branch and a portion of the input clock signal split to the second branch 826-2 is level-shifted by the level shifter circuit 830 to generate a level-shifted signal 814-2 and the level-shifted signal 814-2 is provided to the transistor m6. FIG. 8 illustrates a signal 814-1 being provided to the transistor m5 (namely, to the gate terminal of the transistor m5), and a signal 814-2 being provided to the transistor m6 (namely, to the gate terminal of the transistor m6). The signal 814-1 may be substantially the same as the signal 714 in terms of its voltage swing (e.g., from about 0 to about 1V, as shown for the example of FIG. 8), while the signal 814-2 may be a level-shifted signal compared to the signal 714, having a voltage swing from about −0.4V to about 0.5V. The circuit 804 is further configured to combine an output of the transistor m5 (e.g., an output from the drain terminal of the transistor m5) and an output of the transistor m6 (e.g., an output from the drain terminal of the transistor m6) to generate the output clock signal 716. Thus, the gate terminal of each of the transistors m5 and m6 may be coupled to the input 822, except that the gate terminal of the transistor m6 is coupled to the input 822 via the level shifter circuit 830, configured to perform level-shifting prior to providing the signal to the transistor m6. Similarly, the drain terminal of each of the transistors m5 and m6 may be coupled to the output 824, which may be coupled to the switch 706 to be driven by the switch driver circuit 804.

In some embodiments, the level shifter circuit 830 may include a voltage controller circuit 832 that may be configured to receive a reference signal 834 as an input and generate an output 836, as shown in FIG. 8. Furthermore, the level shifter circuit 830 may further include a coupling capacitor 838, coupled to the voltage controller circuit 832. For example, the first capacitor electrode of the coupling capacitor 838 may be coupled to the input 822, while the second capacitor electrode of the coupling capacitor 838 may be coupled to each of the voltage controller circuit 832 and the gate terminal of the transistor m6. In other words, a portion of the input clock signal 714 split to the second branch 826-2 of the circuit 804 may be configured to be applied to the first capacitor electrode of the coupling capacitor 838, while the second capacitor electrode of the coupling capacitor 838 may be coupled to each of the output 836 of the voltage controller circuit 832 and to the gate terminal of the transistor m6. The input 834 to the voltage controller circuit 832 may be a reference voltage or any other control signal configured to control the minimum voltage level set by the voltage controller circuit 832. The output 836 from the voltage controller circuit 832 may form basis for the level-shifted input clock signal 814-2 to be provided to the gate terminal of the transistor m6.

When the transistor m6 is an N-type transistor, as shown in the embodiment of FIG. 8, the voltage controller circuit 832 may be configured to control the minimum voltage value in the level-shifted input clock signal 814-2 provided to the transistor m6 and, consequently, in the output signal 716. To this end, the input to the PMOS transistor m5 may come directly from the 1V domain inverter output 114 (swings 0V to 1V), as the input 814-1 as shown in FIG. 8, while the input to the NMOS transistor m6 may be level-shifted via the coupling capacitor 838 with the voltage controller circuit 832 to provide a minimum switching voltage of, for example, −0.4V and a maximum switching voltage of, ideally, −0.4V+1V=0.6V. Due to capacitor charge redistribution, the capacitor coupled signal swing at the output Nout of the level shifter circuit 830 may be attenuated by the ratio related to the size of the coupling capacitor 828 to the size of capacitance on the gate of the NMOS transistor m6 plus routing parasitic capacitance. With that, the signal at the output Nout of the level shifter circuit 830 may swing from −0.4V to −0.4V+0.9V=0.5V (instead of the ideal 0.6V that would result in the preservation of 1V swing from the input Nin of the level shifter circuit 830 to the output Nout of the level shifter circuit 830), as is shown with the signal 814-2 illustrated in FIG. 8. The voltage controller circuit 832 or the level shifter circuit 830 as shown in FIG. 8 may be referred to as a "min level controller" because is configured to set the maximum voltage value of the level-shifted input clock signal 814-2. The maximum voltage value of the level-shifted input clock signal 814-2 may then be adjusted automatically based on a ratio between the capacitance of the coupling capacitor 838 and the capacitance of the load for the voltage controller circuit 832.

Figure 12:
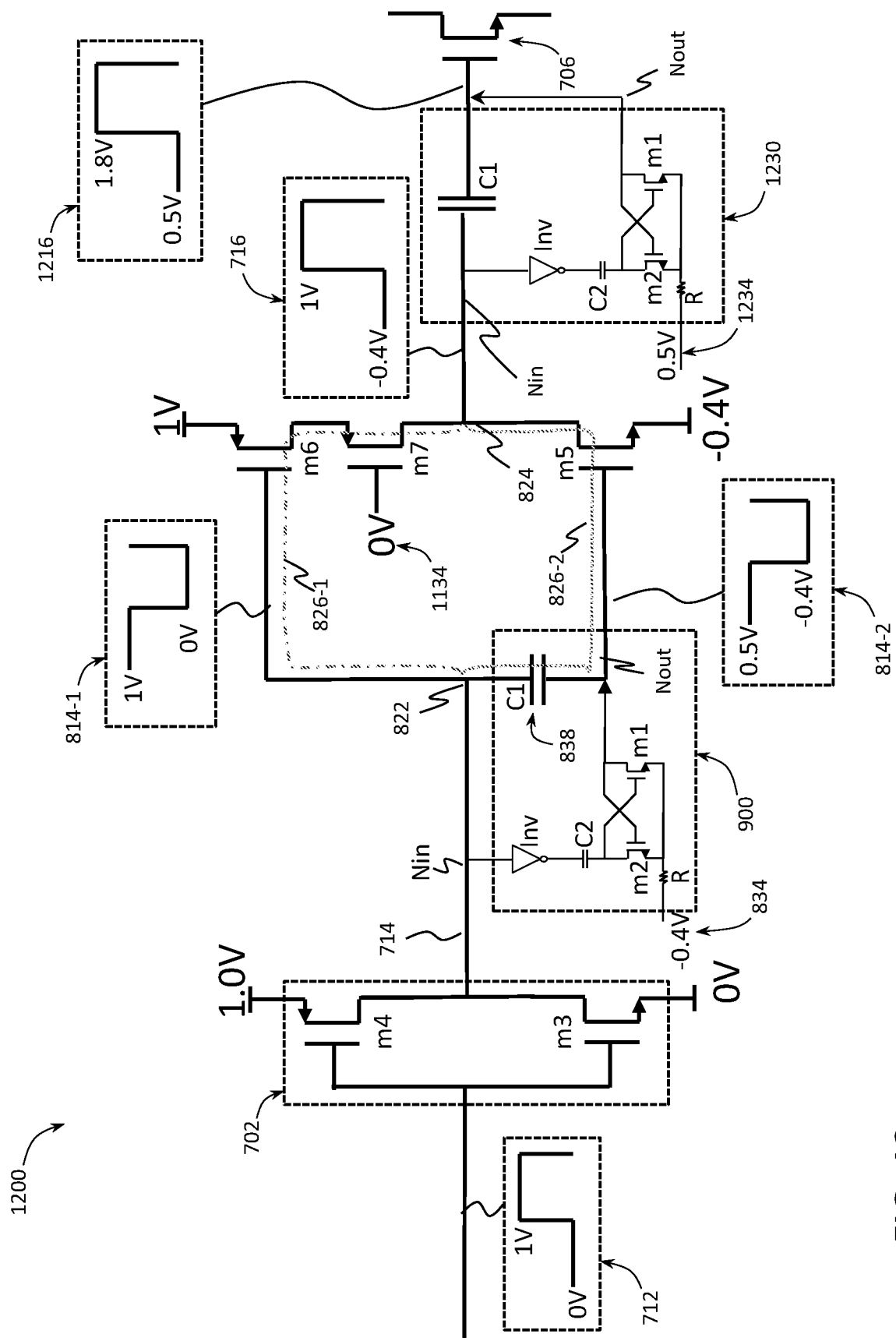
FIG. 12 provides an electric circuit diagram of an example circuit with a boosted switch driver with level shifting in the branch of the N-type transistor and with an additional level shifter configured to control the minimum/low level, according to some embodiments of the present disclosure.

In some embodiments of the level shifter circuit coupled to the N-type transistor of the boosted switch driver circuit (e.g., as shown in FIG. N), the low supply voltage coupled to the source terminal of the N-type transistor (i.e., transistor m6 in this case) may be substantially the same as the minimum voltage value controlled by the voltage controller circuit 832 (e.g., both may be −0.4V), although in other embodiments these voltages may be different. In general, the value of the supply voltage coupled to the source terminal of the N-type transistor of the branch which also includes the min level controller (i.e., of the transistor m6 in this case) may correspond to (e.g., be substantially equal to) the low voltage in the level-shifted input clock signal 814-2. In some embodiments of the circuit 804, the high supply voltage coupled to the source terminal of the P-type transistor of the branch that does not include a level shifter circuit (i.e. of the transistor m5 in this case) may be substantially the same as the maximum voltage value in the output signal 716 (e.g., both may be 1V), although in other embodiments these voltages may be different (e.g., in case the second level shifter circuit is included, e.g., as shown in FIG. 12).

Figure 9:
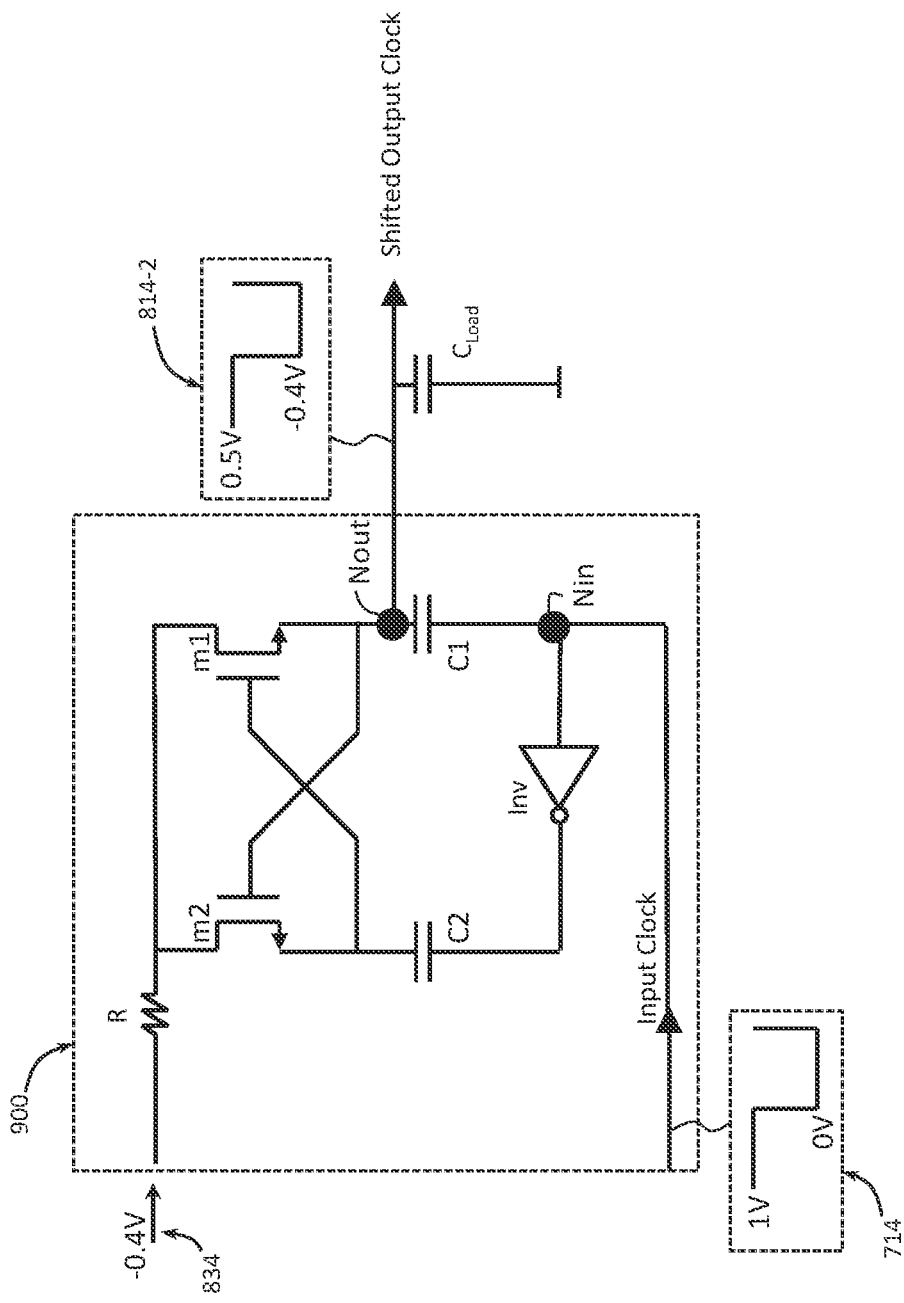
FIG. 9 provides an electric circuit diagram of an example level shifter circuit configured to perform level-shifting with controlling the minimum/low signal level, according to some embodiments of the present disclosure.

In various embodiments, the level shifter circuit 830 may be implemented in any manner that allows careful control of the minimum value of the level-shifted input clock signal 814-2 to be provided to the N-type transistor m6. One example is shown in FIG. 9, however, in other embodiments of the circuit 804, the level shifter circuit 830 may be implemented differently. FIG. 9 provides an electric circuit diagram of an example level shifter circuit 900 that may be used with/in a boosted switch driver, e.g., as the level shifter circuit 830 of the boosted switch driver 804, to perform level-shifting with controlling the minimum/high signal level according to some embodiments of the present disclosure.

As shown in FIG. 9, the level shifter circuit 900 may include a pair of cross-coupled transistors m1 and m2, a pair of capacitors C1 and C2, and an inverter Inv. The arrangement of the level shifter circuit 900 is substantially the same as that of the level shifter circuit 300 except that the transistors m1 and m2 are N-type transistors in the level shifter circuit 900 because the level shifter circuit 900 is a min level controller. Descriptions on the coupling between various elements of the level shifter circuit 300 are applicable to the level shifter circuit 900 and, therefore, in the interests of brevity, are not repeated.

When the level shifter circuit 900 is a min level controller, the value of the reference voltage 834 may be configured to correspond to the low voltage in the level-shifted input clock signal 814-2 output by the circuit. In some embodiments, the reference voltage 834 may be substantially the same as the supply voltage to which the source terminal of the transistor m6 is coupled to (e.g., both may be about −0.4V for the example shown in FIGS. 8 and 9), and may come from the same voltage source.

Because the level shifter circuit 900 is a min level controller, the reference voltage 834 applied to the source terminals of the transistors m1 and m2 may accurately control the minimum/low level of the output voltage of the signal 814-2 (e.g., make sure that level is about −0.4V). The maximum/high level of the output voltage of the signal 814-2 may then be established based on the capacitor charge redistribution between the capacitor C1 and the load capacitance $C_{load}$, which is based on the ratio of these capacitances. Thus, the voltage swing of the output signal 814-2 may be based on the value of the reference voltage 834 provided to the level shifter circuit 900 and based on the capacitor charge redistribution between the capacitor C1 and the load capacitance $C_{load}$.

Figure 10:
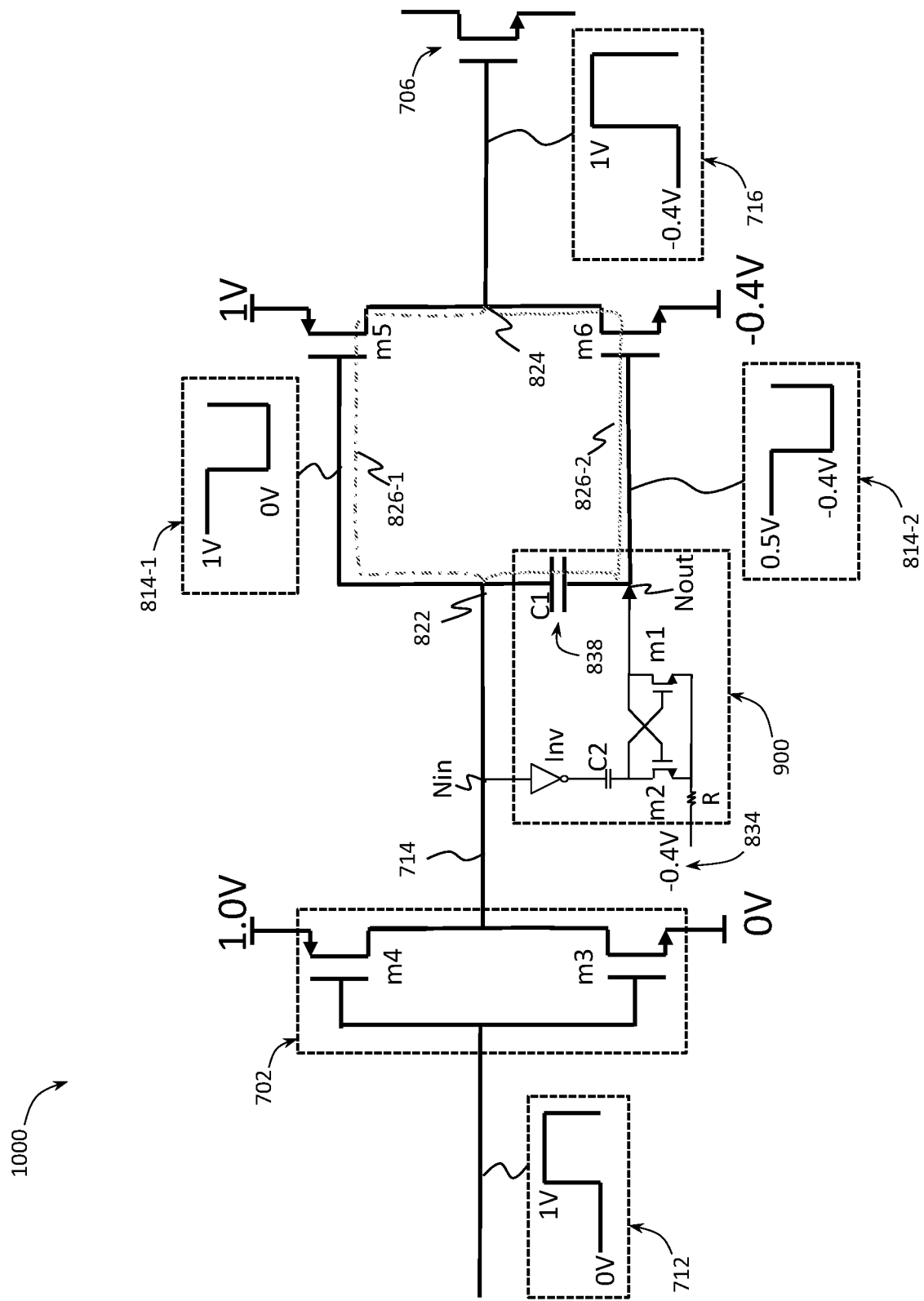
FIG. 10 provides an electric circuit diagram of an example circuit with a boosted switch driver with level shifting in the branch of the N-type transistor implemented using the level shifter circuit of FIG. 9, according to some embodiments of the present disclosure.

FIG. 10 provides an electric circuit diagram of an example circuit 1000 with a boosted switch driver with level shifting in the branch of the N-type transistor implemented using the level shifter circuit 900 of FIG. 9, according to some embodiments of the present disclosure. The circuit 1000 may be seen as an example of the circuit 800 where the level shifter circuit 830 is implemented as and, therefore, replaced by (in the schematic illustration of FIG. 10), the level shifter circuit 900. In FIG. 10, reference numerals that were used for the circuits of FIGS. 7-9 are used to refer to the same or functionally analogous elements as those shown in FIGS. 7-9, so that their descriptions are not repeated for FIG. 10. Furthermore, various components of the level shifter circuit 900 shown in FIG. 9 and described above, such as the transistors m1 and m2, capacitors C1 and C2, and the inverter Inv, are also shown in FIG. 10 to make clear how the level shifter circuit 900 replaces the level shifter circuit 830 that was shown in FIG. 8 for this embodiment. It should be noted that in the embodiment of FIG. 10 the coupling capacitor 838 of the level shifter circuit 830 is realized by the capacitor C1 of the level shifter circuit 900. Input and output nodes Nin and Nout of the level shifter circuit 900 are also shown in FIG. 10 in context of the circuit 1000.

Figure 11:
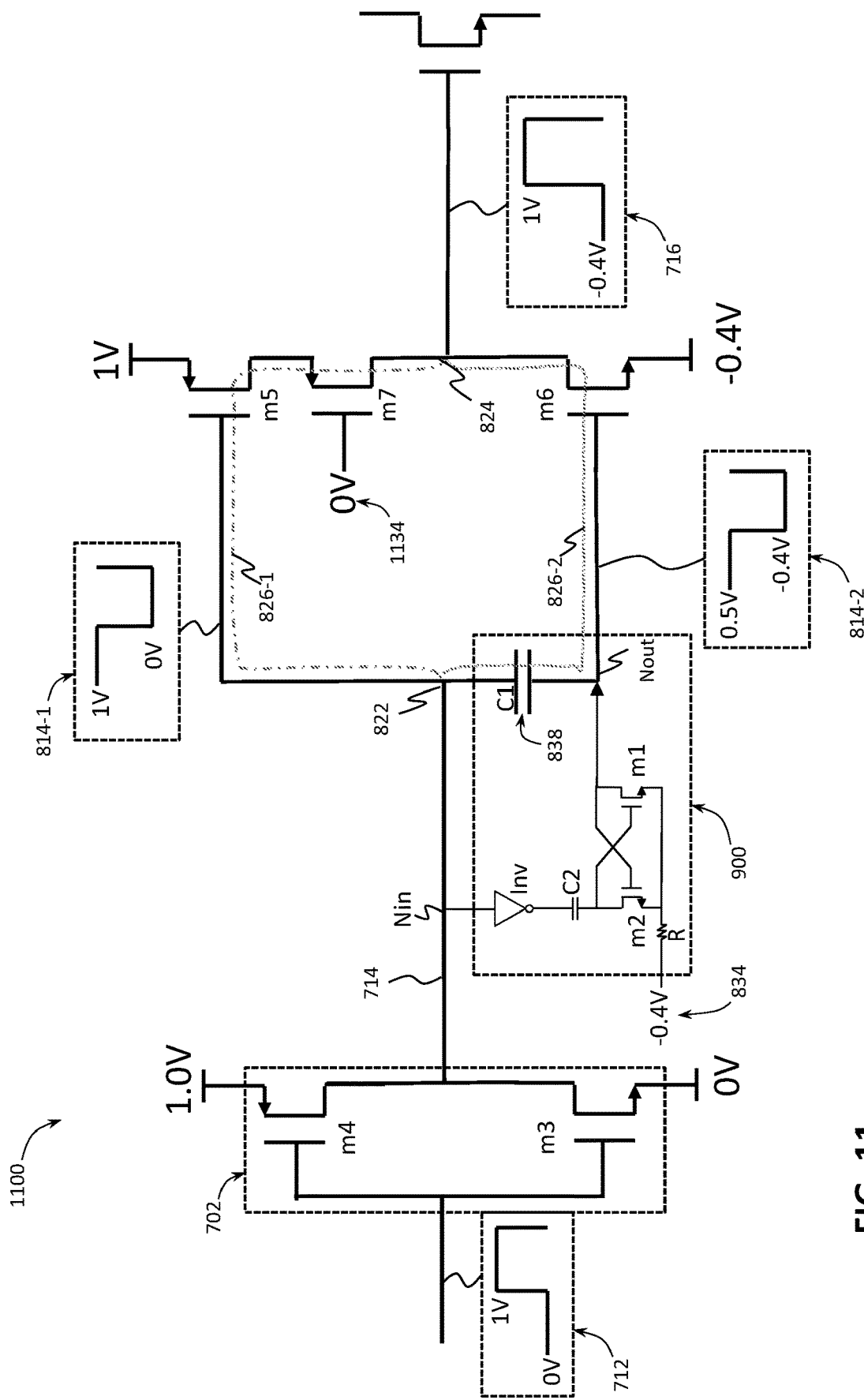
FIG. 11 provides an electric circuit diagram of an example circuit with a boosted switch driver with level shifting in the branch of the N-type transistor and with an additional transistor provided as a cascode transistor to the P-type transistor, according to some embodiments of the present disclosure.

FIG. 11 provides an electric circuit diagram of an example circuit 1100 with a boosted switch driver with level shifting in the branch of the N-type transistor (i.e., of the transistor m6 for the example shown) and with an additional transistor provided as a cascode transistor to the P-type transistor of the other branch (i.e., to the transistor m5 for the example shown), according to some embodiments of the present disclosure. The circuit 1100 may be seen as a further embodiment of the circuit 1000 where, similar to the circuit 1000, the level shifter circuit 830 is implemented as and, therefore, replaced by, in the schematic illustration of FIG. 11, the level shifter circuit 900. In FIG. 11, reference numerals that were used for the circuits of FIGS. 7-10 are used to refer to the same or functionally analogous elements as those shown in FIGS. 7-10, so that their descriptions are not repeated for FIG. 11 and only the differences are described. The circuit 1100 differs from the circuit 1000 in that the circuit 1100 further includes an additional transistor m7 provided as a cascode transistor to the transistor m5, described above. To that end, the transistors m5 and m7 may be transistors of the same type (i.e., both are P-type transistors, as is shown in the illustration of FIG. 11). The cascode transistor m7 may be seen as a part of the first branch 826-1. As shown in FIG. 11, the drain terminal of the transistor m5 may be coupled to the output 824 by having the drain terminal of the transistor m5 being coupled to the source terminal of the cascode transistor m7, and having the drain terminal of the cascode transistor m7 being coupled to the output 224. In various embodiments, the gate terminal of the cascode transistor m7 may be coupled to a suitable reference voltage 1134. For example, the reference voltage 1134 may be approximately 0V for the embodiments where the cascode transistor m7 is a P-type transistor as is the case shown (i.e., for the embodiments where the level shifter circuit included in the circuit 1100 is a min level controller). However, in other embodiments, the value of the reference voltage 1134 may be different.

Although only one cascode transistor m7 is shown in FIG. 11, in other embodiments of the circuit shown in FIG. 11, more than one cascode transistors m7 may be included in the first branch 826-1. While FIG. 11 illustrates the cascode transistor m7 in combination with the level shifter circuit 900 of FIG. 9, in further embodiments of the circuit 800 shown in FIG. 8, the first branch 826-1 of the circuit 800 may include at least one such a cascode transistor m7, where the level shifter circuit 830 may, but does not have to be implemented as the level shifter circuit 900. Furthermore, in any of the embodiments of a boosted switch driver with level shifting in the branch of the N-type transistor (e.g., any of the embodiments described with reference to FIGS. 7-12), one or more additional transistors m8 (not specifically shown in the drawings) may be provided as cascode transistors to the transistor m6 (i.e., as cascode transistors to the N-type transistor of the level shifter circuit). To that end, the transistors m6 and m8 may be transistors of the same type (e.g., both are N-type transistors), and the one or more cascode transistors m8 may be seen as a part of the second branch 826-2. For example, the source terminal of such a cascode transistor m8 may be coupled to the drain terminal of the transistor m6, and the drain terminal of the cascode transistor m8 may be coupled to the output 224. The gate terminal of such a cascode transistor m8 may be coupled to a suitable reference voltage, e.g., approximately 1V for the embodiments where the cascode transistor m8 is an N-type transistor (because the transistor m6 is an N-type transistor for the embodiments of FIGS. 7-12; i.e., for the embodiments where the level shifter circuit included in the circuit 1100 is a min level controller). However, in other embodiments, the value of the reference voltage coupled to the gate terminal of the additional cascode transistor m8 may be different.

FIG. 12 provides an electric circuit diagram of an example circuit 1200 with a boosted switch driver with level shifting in the branch of the N-type transistor and with an additional level shifter circuit configured to control the minimum/low level of a final output signal 1216, according to some embodiments of the present disclosure. The circuit 1200 may be seen as a further embodiment of the circuit 1100 where, similar to the circuit 1100, the level shifter circuit 830 that is coupled to the input to the transistor m5 is implemented as and, therefore, replaced by (in the schematic illustration of FIG. 12), the level shifter circuit 900. Also similar to the circuit 1100, the circuit 1200 further includes the cascode transistor m7. In FIG. 12, reference numerals that were used for the circuits of FIGS. 7-11 are used to refer to the same or functionally analogous elements as those shown in FIGS. 7-11, so that their descriptions are not repeated for FIG. 12 and only the differences are described. The circuit 1200 differs from the circuit 1100 in that the circuit 1200 further includes another instance of the level shifter circuit 900 of FIG. 9, labeled in FIG. 12 as a level shifter circuit 1230, configured to control the minimum/low level of the output signal 1216 from the circuit 1200 based on a reference signal 1234. Since operation of the level shifter circuit 900 has been described in detail above, this description is not repeated here with reference to the circuit 1230. The reference signal 1234 is analogous to the reference signal 834, described above, except its value may be different for the level shifter circuit 1230. For example, if the input signal provided at the input node Nin of the level shifter circuit 1230 is the signal 716 as described above, having the minimum and the maximum voltage values of −0.4V and 1V, respectively, then the level shifter circuit 1230 may shift these values by about 0.9V (i.e., the value of the reference voltage 1234 may be 0.5V, as shown in FIG. 12). In particular, the level shifter circuit 1230 may be configured to carefully control that the minimum voltage value is shifted by the value based on the reference voltage 1234, i.e., that the minimum voltage value is shifted from −0.4V to 0.5V, for the example shown. Ideally, the maximum switching voltage would then be 1V+0.9V=1.9V. However, as described above for the circuit 900, due to capacitor charge redistribution, the capacitor coupled signal swing at the output Nout of the level shifter circuit 1230 may be attenuated by the ratio related to the size of the coupling capacitor C1 of the level shifter circuit 1230 to the size of capacitance on the gate of the transistor that may implement the switch 706 plus routing parasitic capacitance. With that, the signal at the output Nout of the level shifter circuit 1230 may swing from 0.5V to 0.5V+1.3V=1.8V (instead of the ideal 1.9V that would result in the preservation of the 1.4V swing from the input Nin of the level shifter circuit 1230 to the output Nout of the level shifter circuit 1230), as is shown with the signal 1216 illustrated in FIG. 12. Thus, the level shifter circuit 1230 may carefully control, based on the reference signal 1234, the minimum/low value of the level-shifted clock signal 1216, while the maximum/high voltage value of the level-shifted clock signal 1216 may then be adjusted automatically based on a ratio between the capacitance of the coupling capacitor C1 of the level shifter circuit 1230 and the capacitance of the load for the level shifter circuit 1230, including parasitic capacitance. In other words, since the level shifter circuit 1230 is a min level controller, the reference voltage 1234 applied to the source terminals of the transistors m1 and m2 of the level shifter circuit 630 may accurately control the minimum/low level of the output voltage of the signal 1216 (e.g., make sure that level is about 0.5V). The maximum/high level of the output voltage of the signal 1216 may then be established based on the capacitor charge redistribution between the capacitor C1 of the level shifter circuit 1230 and the load capacitance $C_{Load}$ for the level shifter circuit 1230, which is based on the ratio of these capacitances. As a result, the voltage swing of the output signal 1216 may be based on the value of the reference voltage 834 provided to the level shifter circuit 900, the value of the reference voltage 1234 provided to the level shifter circuit 1230, and the capacitor charge redistribution between the capacitor C1 of the level shifter circuit 1230 and the load capacitance $C_{load}$ of the level shifter circuit 1230.

Although not specifically shown in FIG. 12, in other embodiments of the circuit 1230, the input to the inverter Inv of the level shifter circuit 1230 may be based on an inverted version of the input signal 714 that was provided to the input 822, as opposed to the output signal 716 from the output 824 as is shown in FIG. 12. In such embodiments, the inverter of the level shifter circuit 1230 may be decoupled from the signal 716, but coupled to the inverted version of the signal 714 instead, which could be advantageous in cases when it may not be reliable to drive the inverter of the level shifter circuit 1230 with a signal having a signal swing larger than about 1V. In such embodiments, one of the capacitor electrodes of the capacitor C1 of the level shifter circuit 1230 is still driven by the signal 716 so that the level shifter circuit 1230 may then generate an output signal, provided at the output node Nout of the level shifter circuit 1230, as a level-shifted version of the signal 716 provided at the input node Nin of the level shifter circuit 1230 where the minimum/low value of the signal is carefully controlled based on the reference signal 1234.

FIG. 12 illustrates one manner in how the level shifter circuit 1230 may be implemented to provides control of the minimum/low level of the output voltage of the signal 1216 as described above. In other embodiments of the circuit 1200, the level shifter circuit 1230 may be replaced by any circuit configured to provide a sufficiently accurate control of the minimum/low level of the output voltage of the signal 1216, with the maximum/high level being adjusted accordingly.

While FIG. 12 illustrates the additional level shifter circuit 1230 in combination with the level shifter circuit 900 of FIG. 9, in further embodiments of the circuit 800 shown in FIG. 8, the additional level shifter circuit 1230 may be included to receive the signal 716 as an input and to generate the output 1216 as described with reference to FIG. 12 where the level shifter circuit 830 may, but does not have to be implemented as the level shifter circuit 900. Furthermore, while FIG. 12 illustrates the additional level shifter circuit 1230 in combination with the cascode transistor m7 of FIG. 11, in further embodiments of the circuit 800 shown in FIG. 8, the additional level shifter circuit 1230 may be included as described with reference to FIG. 12 without the cascode transistor m7. Still in further embodiments of the circuit 800 shown in FIG. 8, the additional level shifter circuit 1230 may be included as described with reference to FIG. 12 without the cascode transistor m7 and where the level shifter circuit 830 is implemented differently from the level shifter circuit 900. In any of these embodiments, the level shifter circuit 1230 may be implemented in any other manner than the one shown in FIG. 12, as long as it provides a sufficiently accurate control of the minimum/low level of the output voltage of the signal 1216 as described above.

Still further, while FIG. 12 illustrates the level shifter circuit 1230 configured to provide control of the minimum/low level of the output voltage of the signal 1216 as described above, in other embodiments, the level shifter circuit 1230 may be replaced with a level shifter circuit 1230' (not shown in FIG. 12 but the reference numeral used here for the ease of the descriptions), configured to provide control of the maximum/high level of the output voltage of the signal 1216. In some such embodiments, in order to realize the level shifter circuit 1230', the level shifter circuit 1230 shown in FIG. 12 may be replaced with the level shifter circuit 300, or, equivalently, the NMOS transistors of the level shifter circuit 1230 shown in FIG. 12 may be replaced with PMOS transistors and the reference voltage 1234 may be a replaced with a reference voltage 1234' (also not shown in FIG. 12 but the reference numeral used here for the ease of the descriptions), configured to accurately control the maximum/high level of the output voltage of the signal 1216.

The input to the level shifter circuit 1230' may be applied/provided to a node Nin of the circuit 1230', coupled to the first capacitor electrode of the capacitor C1 and, in some embodiments, to the input to the inverter Inv, as shown in FIG. 12. In some embodiments, the input to the level shifter circuit 1230' may be based on the output signal 716 from the boosted switch driver circuit 204, i.e., on the signal from −0.4V to 1V for the example shown in FIG. 12. The level shifter circuit 1230' may generate an output signal from an output node Nout of the circuit 1230', coupled to one or more of the second capacitor electrode of the capacitor C1, the drain terminal of the transistor m1, and the gate terminal of the transistor m2. The output signal 1216 from the output node Nout of the level shifter circuit 1230' may be a level-shifted version of the input signal provided at the input node Nin (e.g., the signal 716) of the level shifter circuit 1230' where the maximum/high value of the signal is carefully controlled based on the reference signal 1234'. For example, if the input signal provided at the input node Nin of the level shifter circuit 1230' is the signal 716 as described above, having the minimum and the maximum voltage values of −0.4V and 1V, respectively, then the level shifter circuit 1230' may shift these values so that the maximum voltage value is 1.8V, which would be the value of the reference voltage 1234' for such an example. In particular, the level shifter circuit 1230' is configured to carefully control that the maximum voltage value is shifted by the value based on the reference voltage 1234', i.e., that the maximum voltage value is shifted by 0.8V, from 1V to 1.8V, for the example shown. Ideally, the minimum switching voltage would then be −0.4V+0.8V=0.4V. However, as was described above for the max voltage controller 300, due to capacitor charge redistribution, the capacitor coupled signal swing at the output Nout of the level shifter circuit 1230' may be attenuated by the ratio related to the size of the coupling capacitor C1 of the level shifter circuit 1230' to the size of capacitance on the gate of the transistor that may implement the switch 706 plus routing parasitic capacitance. With that, the minimum voltage value at the output Nout of the level shifter circuit 1230' may be 1.8V−1.3V=0.5V (instead of the ideal 0.4V that would have resulted in the preservation of the 1.4V swing from the input Nin of the level shifter circuit 1230' to the output Nout of the level shifter circuit 1230'), as is shown with the signal 1216 illustrated in FIG. 12. Thus, the level shifter circuit 1230' may carefully control, based on the reference signal 1234', the maximum/high value of the level-shifted clock signal 1216, while the minimum/low voltage value of the level-shifted clock signal 1216 may then be adjusted automatically based on a ratio between the capacitance of the coupling capacitor C1 of the level shifter circuit 1230' and the capacitance of the load for the level shifter circuit 1230', including parasitic capacitance. In other words, since the level shifter circuit 1230' is a max level controller, the reference voltage 1234' applied to the source terminals of the transistors m1 and m2 of the level shifter circuit 1230' may accurately control the maximum/high level of the output voltage of the signal 1216 (e.g., make sure that level is about 1.8V). The minimum/low level of the output voltage of the signal 1216 may then be established based on the capacitor charge redistribution between the capacitor C1 of the level shifter circuit 1230' and the load capacitance $C_{load}$ for the level shifter circuit 1230', which is based on the ratio of these capacitances. As a result, the voltage swing of the output signal 1216 may be based on the value of the reference voltage 834 provided to the level shifter circuit 900, the value of the reference voltage 1234' provided to the level shifter circuit 1230', and the capacitor charge redistribution between the capacitor C1 of the level shifter circuit 1230' and the load capacitance $C_{Load}$ of the level shifter circuit 1230'.

Similar to the variation for the level shifter circuit 1230 shown in FIG. 12, described above, in other embodiments of the circuit 1230', the input to the inverter Inv of the level shifter circuit 1230' may be based on an inverted version of the input signal 714 that was provided to the input 822, as opposed to the output signal 716 from the output 824 as is shown in FIG. 12. In such embodiments, the inverter of the level shifter circuit 1230' may be decoupled from the signal 716, but coupled to the inverted version of the signal 714 instead, which could be advantageous in cases when it may not be reliable to drive the inverter of the level shifter circuit 1230' with a signal having a signal swing larger than about 1V. In such embodiments, one of the capacitor electrodes of the capacitor C1 of the level shifter circuit 1230' is still driven by the signal 716 so that the level shifter circuit 1230' may then generate an output signal, provided at the output node Nout of the level shifter circuit 1230', as a level-shifted version of the signal 716 provided at the input node Nin of the level shifter circuit 1230' where the maximum/high value of the signal is carefully controlled based on the reference signal 1234'.

In other embodiments of the circuit 1200, the level shifter circuit 1230' may be implemented in any other manner than the level shifter circuit 300, as long as it provides a sufficiently accurate control of the maximum/high level of the output voltage of the signal 1216, with the minimum/low level being adjusted accordingly.

Example Systems and Devices

Figure 13:
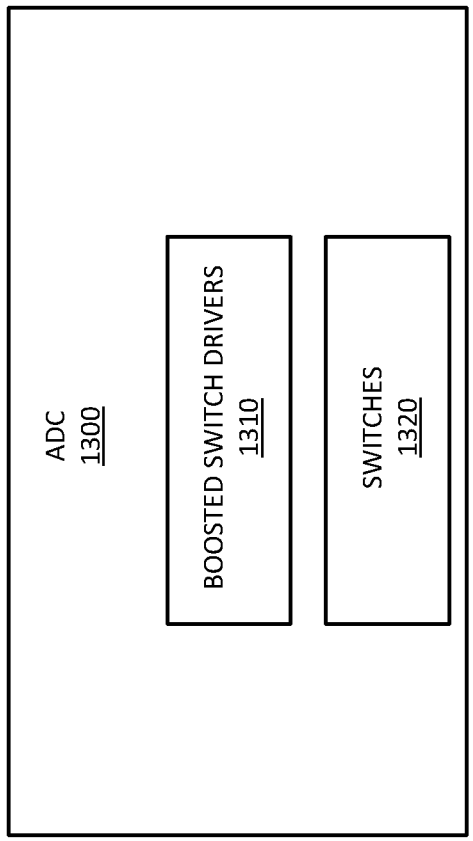
FIG. 13 provides a schematic illustration of an example component in which one or more boosted switch drivers may be implemented, according to some embodiments of the present disclosure.
Figure 14:
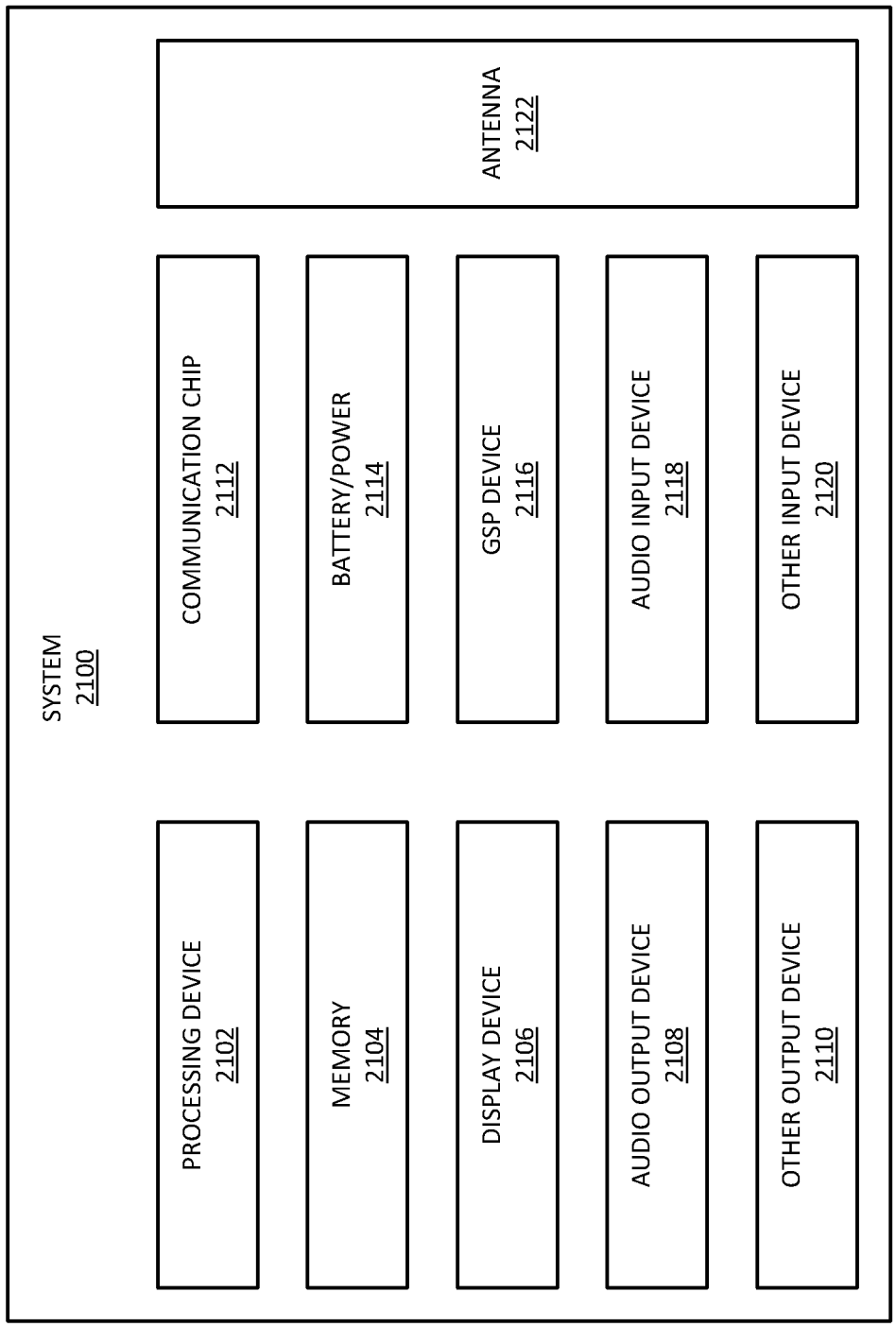
FIG. 14 is a block diagram of an example system that may include one or more boosted switch drivers, according to some embodiments of the present disclosure.
Figure 15:
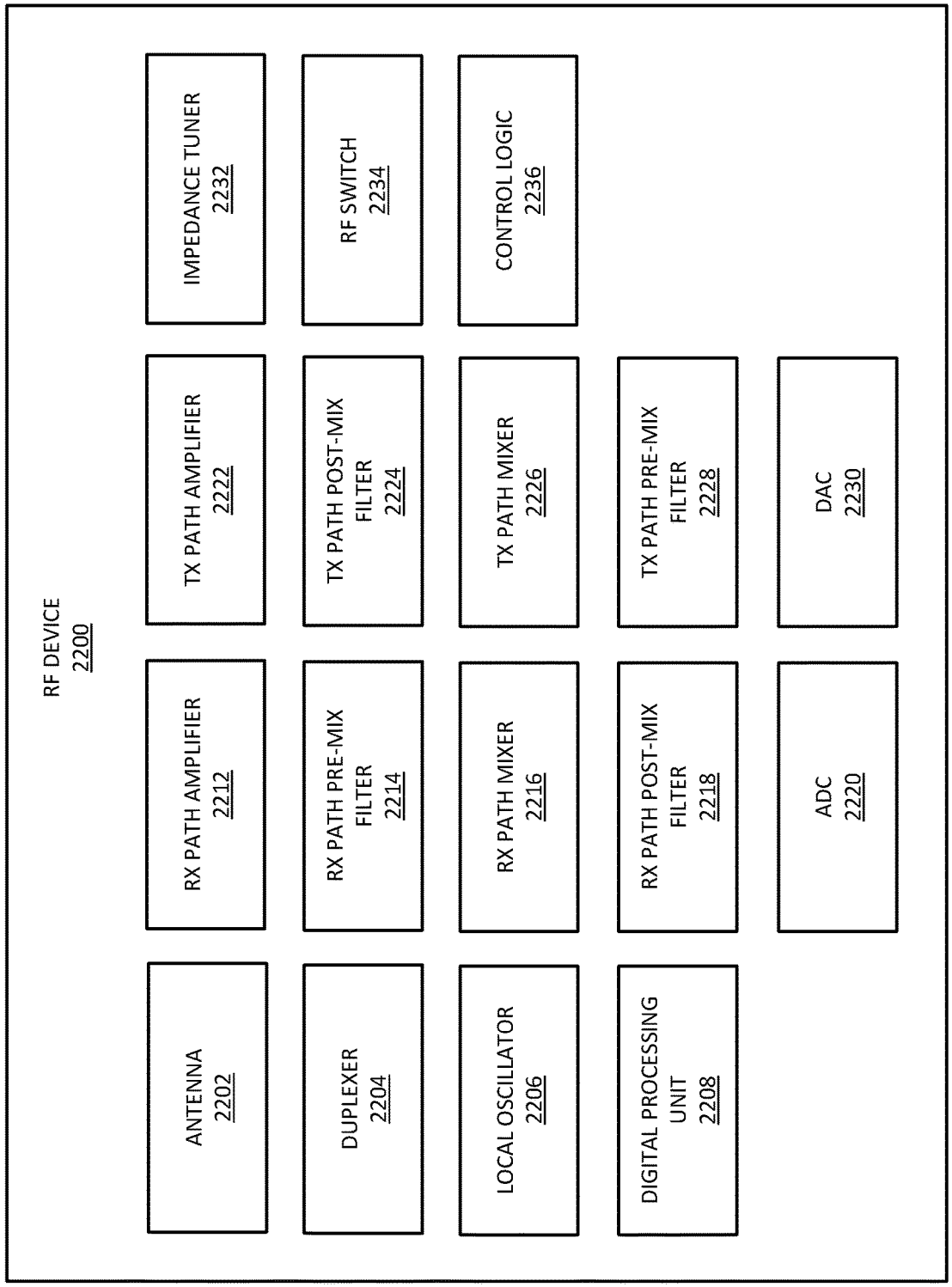
FIG. 15 is a block diagram of an example RF device that may include one or more boosted switch drivers, according to some embodiments of the present disclosure.

Boosted switch driver circuits as described herein, or portions thereof (e.g., only the portions of the inverter circuits 104 and/or 704 as described herein) may be included in any suitable system, device, or apparatus. For example, in some embodiments, any of the boosted switch drivers or portions thereof may be included in an ADC, as shown in FIG. 13. In other embodiments, any of the boosted switch drivers or portions thereof may be included in a larger system or device that is configured to perform analog-to-digital conversion. Some examples of such systems and devices are shown in FIGS. 14 and 15. Other examples of systems and devices that include one or more of the boosted switch drivers as described herein are possible and within the scope of the present disclosure.

FIG. 13 provides a schematic illustration of an example component 1300, e.g., an ADC, in which one or more boosted switch drivers 1310 may be implemented, according to some embodiments of the present disclosure. The one or more boosted switch drivers 1310 may include any of the boosted switch driver circuits described above, e.g., any embodiments of the boosted switch drivers described with reference to FIGS. 1-12. The one or more boosted switch drivers 1310 may be configured to drive one or more switches 1320. In some embodiments, there may be a one-to-one correspondence between the one or more boosted switch drivers 1310 and the one or more switches 1320 (i.e., each boosted switch driver 1310 may be configured to drive only one of the switches 1320 and each of the switches 1320 may be configured to be driven by only one of the boosted switch drivers 1310). In other embodiments, a single boosted switch driver 1310 may drive more than one of the switches 1320 and/or a single one of the switches 1320 may be driven by more than one of the boosted switch drivers 1310.

FIG. 14 is a block diagram of an example system 2100, e.g., a computing device, that may include one or more boosted switch drivers, in accordance with any of the embodiments disclosed herein. For example, any suitable ones of the components of the system 2100 may include one or more of the boosted switch drivers disclosed herein. Several components are illustrated in FIG. 14 as included in the system 2100, but any one or more of these components may be omitted or duplicated, as suitable for the application. In some embodiments, some or all the components included in the system 2100 may be attached to one or more motherboards. In some embodiments, some or all these components are fabricated onto a single system-on-a-chip (SoC) die.

Additionally, in various embodiments, the system 2100 may not include one or more of the components illustrated in FIG. 14, but the system 2100 may include interface circuitry for coupling to the one or more components. For example, the system 2100 may not include a display device 2106, but may include display device interface circuitry (e.g., a connector and driver circuitry) to which a display device 2106 may be coupled. In another set of examples, the system 2100 may not include an audio input device 2118 or an audio output device 2108, but may include audio input or output device interface circuitry (e.g., connectors and supporting circuitry) to which an audio input device 2118 or audio output device 2108 may be coupled.

The system 2100 may include a processing device 2102 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2102 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The system 2100 may include a memory 2104, which may itself include one or more memory devices such as volatile memory (e.g., dynamic RAM (DRAM)), nonvolatile memory (e.g., read-only memory (ROM)), flash memory, solid state memory, and/or a hard drive. In some embodiments, the memory 2104 may include memory that shares a die with the processing device 2102. This memory may be used as cache memory and may include embedded DRAM (eDRAM) or spin transfer torque magnetic RAM (STT-M RAM).

In some embodiments, the system 2100 may include a communication chip 2112 (e.g., one or more communication chips). For example, the communication chip 2112 may be configured for managing wireless communications for the transfer of data to and from the system 2100. The term "wireless" and its derivatives may be used to describe circuits, devices, systems, methods, techniques, communications channels, etc., that may communicate data using modulated electromagnetic radiation through a nonsolid medium. The term does not imply that the associated devices do not contain any wires, although in some embodiments they might not.

The communication chip 2112 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2112 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2112 may operate in accordance with other wireless protocols in other embodiments. The system 2100 may include an antenna 2122 to facilitate wireless communications and/or to receive other wireless communications (such as AM or FM radio transmissions).

In some embodiments, the communication chip 2112 may manage wired communications, such as electrical, optical, or any other suitable communication protocols (e.g., the Ethernet). As noted above, the communication chip 2112 may include multiple communication chips. For instance, a first communication chip 2112 may be dedicated to shorter-range wireless communications such as Wi-Fi or Bluetooth, and a second communication chip 2112 may be dedicated to longer-range wireless communications such as global positioning system (GPS), EDGE, GPRS, CDMA, WiMAX, LTE, EV-DO, or others. In some embodiments, a first communication chip 2112 may be dedicated to wireless communications, and a second communication chip 2112 may be dedicated to wired communications.

The system 2100 may include battery/power circuitry 2114. The battery/power circuitry 2114 may include one or more energy storage devices (e.g., batteries or capacitors) and/or circuitry for coupling components of the system 2100 to an energy source separate from the system 2100 (e.g., AC line power).

The system 2100 may include a display device 2106 (or corresponding interface circuitry, as discussed above). The display device 2106 may include any visual indicators, such as a heads-up display, a computer monitor, a projector, a touchscreen display, a liquid crystal display (LCD), a light-emitting diode display, or a flat panel display.

The system 2100 may include an audio output device 2108 (or corresponding interface circuitry, as discussed above). The audio output device 2108 may include any device that generates an audible indicator, such as speakers, headsets, or earbuds.

The system 2100 may include an audio input device 2118 (or corresponding interface circuitry, as discussed above). The audio input device 2118 may include any device that generates a signal representative of a sound, such as microphones, microphone arrays, or digital instruments (e.g., instruments having a musical instrument digital interface (MIDI) output).

The system 2100 may include a GPS device 2116 (or corresponding interface circuitry, as discussed above). The GPS device 2116 may be in communication with a satellite-based system and may receive a location of the system 2100, as known in the art.

The system 2100 may include another output device 2110 (or corresponding interface circuitry, as discussed above). Examples of the other output device 2110 may include an audio codec, a video codec, a printer, a wired or wireless transmitter for providing information to other devices, or an additional storage device.

The system 2100 may include another input device 2120 (or corresponding interface circuitry, as discussed above). Examples of the other input device 2120 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The system 2100 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the system 2100 may be any other electronic device that processes data.

Figure 16:
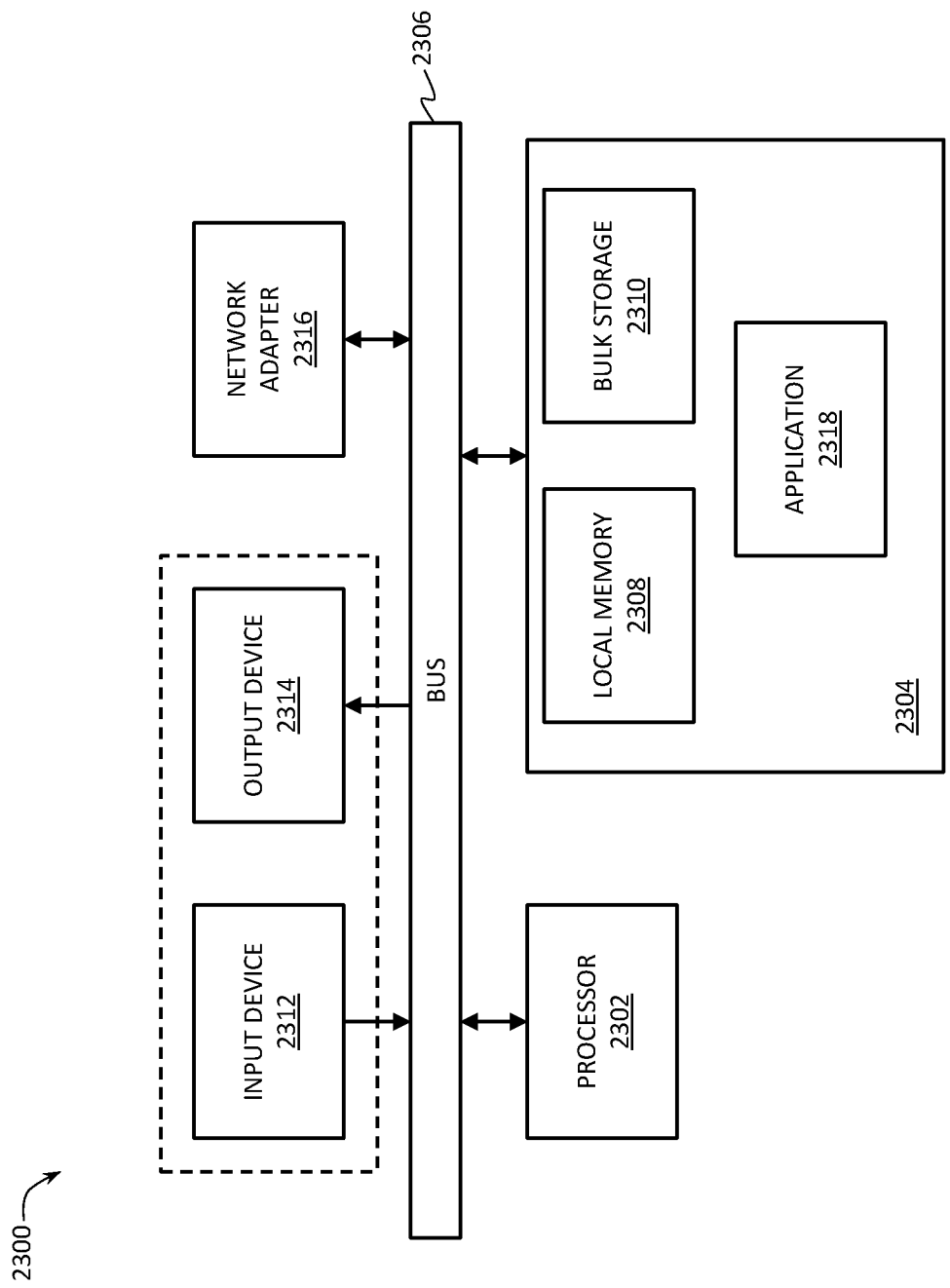
FIG. 16 provides a block diagram illustrating an example data processing system that may be configured to control operation of one or more boosted switch drivers, according to some embodiments of the present disclosure.

FIG. 15 is a block diagram of an example RF device 2200, e.g., an RF transceiver, that may include one or more components with one or more boosted switch drivers in accordance with any of the embodiments disclosed herein. For example, any suitable ones of the components of the RF device 2200 may include a die including at least one boosted switch drivers, or a portion thereof, configured to drive one or more switches in accordance with any of the embodiments disclosed herein. In some embodiments, the RF device 2200 may be included within any components of the system 2100 as described with reference to FIG. 16, or may be coupled to any of the components of the system 2100, e.g., be coupled to the memory 2104 and/or to the processing device 2102 of the system 2100. In still other embodiments, the RF device 2200 may further include any of the components described with reference to FIG. 16, such as, but not limited to, the battery/power circuit 2114, the memory 2104, and various input and output devices as shown in FIG. 16.

In general, the RF device 2200 may be any device or system that may support wireless transmission and/or reception of signals in the form of electromagnetic waves in the RF range of approximately 3 kilohertz (kHz) to approximately 300 Gigahertz (GHz). In some embodiments, the RF device 2200 may be used for wireless communications, e.g., in a base station (BS) or a user equipment (UE) device of any suitable cellular wireless communications technology, such as GSM, WCDMA, or LTE. In a further example, the RF device 2200 may be used as, or in, e.g., a BS or a UE device of a millimeter-wave wireless technology such as fifth generation (5G) wireless (i.e., high-frequency/short wavelength spectrum, e.g., with frequencies in the range between about 20 and 60 GHz, corresponding to wavelengths in the range between about 5 and 15 millimeters). In yet another example, the RF device 2200 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 2200 may be used for wireless communications using Bluetooth technology (e.g., a frequency band from about 2.4 to about 2.485 GHz, corresponding to a wavelength of about 12 cm). In other embodiments, the RF device 2200 may be used for transmitting and/or receiving RF signals for purposes other than communication, e.g., in an automotive radar system, or in medical applications such as magneto-resonance imaging (MRI).

In various embodiments, the RF device 2200 may be included in frequency-division duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

Several components are illustrated in FIG. 15 as included in the RF device 2200, but any one or more of these components may be omitted or duplicated, as suitable for the application. For example, in some embodiments, the RF device 2200 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2200 may be an RF device supporting only wireless reception (e.g., an RF receiver), in which case it may include the components of the RX path, but not the components of the TX path; or the RF device 2200 may be an RF device supporting only wireless transmission (e.g., an RF transmitter), in which case it may include the components of the TX path, but not the components of the RX path.

In some embodiments, some or all the components included in the RF device 2200 may be attached to one or more motherboards. In some embodiments, some or all these components are fabricated on a single die, e.g., on a single SoC die.

Additionally, in various embodiments, the RF device 2200 may not include one or more of the components illustrated in FIG. 15, but the RF device 2200 may include interface circuitry for coupling to the one or more components. For example, the RF device 2200 may not include an antenna 2202, but may include antenna interface circuitry (e.g., a matching circuitry, a connector and driver circuitry) to which an antenna 2202 may be coupled. In another set of examples, the RF device 2200 may not include a digital processing unit 2208 or a local oscillator 2206, but may include device interface circuitry (e.g., connectors and supporting circuitry) to which a digital processing unit 2208 or a local oscillator 2206 may be coupled.

As shown in FIG. 15, the RF device 2200 may include an antenna 2202, a duplexer 2204, a local oscillator 2206, a digital processing unit 2208. As also shown in FIG. 15, the RF device 2200 may include an RX path that may include an RX path amplifier 2212, an RX path pre-mix filter 2214, a RX path mixer 2216, an RX path post-mix filter 2218, and an ADC 2220. As further shown in FIG. 15, the RF device 2200 may include a TX path that may include a TX path amplifier 2222, a TX path post-mix filter 2224, a TX path mixer 2226, a TX path pre-mix filter 2228, and a DAC 2230. Still further, the RF device 2200 may further include an impedance tuner 2232, an RF switch 2234, and control logic 2236. In various embodiments, the RF device 2200 may include multiple instances of any of the components shown in FIG. 15. In some embodiments, the RX path amplifier 2212, the TX path amplifier 2222, the duplexer 2204, and the RF switch 2234 may be considered to form, or be a part of, an RF front-end (FE) of the RF device 2200. In some embodiments, the RX path amplifier 2212, the TX path amplifier 2222, the duplexer 2204, and the RF switch 2234 may be considered to form, or be a part of, an RF FE of the RF device 2200. In some embodiments, the RX path mixer 2216 and the TX path mixer 2226 (possibly with their associated pre-mix and post-mix filters shown in FIG. 15) may be considered to form, or be a part of, an RF transceiver of the RF device 2200 (or of an RF receiver or an RF transmitter if only RX path or TX path components, respectively, are included in the RF device 2200). In some embodiments, the RF device 2200 may further include one or more control logic elements/circuits, shown in FIG. 15 as control logic 2236, e.g., an RF FE control interface. In some embodiments, the control logic 2236 may be configured to control at least portions of operating any of the boosted switch drivers, as described herein, within any components of the RF device 2200. In some embodiments, the control logic 2236 may be used to perform control other functions within the RF device 2200, e.g., enhance control of complex RF system environment, support implementation of envelope tracking techniques, reduce dissipated power, etc.

The antenna 2202 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2200 is an FDD transceiver, the antenna 2202 may be configured for concurrent reception and transmission of communication signals in separate, i.e., non-overlapping and non-continuous, bands of frequencies, e.g., in bands having a separation of, e.g., 20 MHz from one another. If the RF device 2200 is a TDD transceiver, the antenna 2202 may be configured for sequential reception and transmission of communication signals in bands of frequencies that may be the same or overlapping for TX and RX paths. In some embodiments, the RF device 2200 may be a multi-band RF device, in which case the antenna 2202 may be configured for concurrent reception of signals having multiple RF components in separate frequency bands and/or configured for concurrent transmission of signals having multiple RF components in separate frequency bands. In such embodiments, the antenna 2202 may be a single wide-band antenna or a plurality of band-specific antennas (i.e., a plurality of antennas each configured to receive and/or transmit signals in a specific band of frequencies). In various embodiments, the antenna 2202 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2200 may include more than one antenna 2202 to implement antenna diversity. In some such embodiments, the RF switch 2234 may be deployed to switch between different antennas.

An output of the antenna 2202 may be coupled to the input of the duplexer 2204. The duplexer 2204 may be any suitable component configured for filtering multiple signals to allow for bidirectional communication over a single path between the duplexer 2204 and the antenna 2202. The duplexer 2204 may be configured for providing RX signals to the RX path of the RF device 2200 and for receiving TX signals from the TX path of the RF device 2200.

The RF device 2200 may include one or more local oscillators 2206, configured to provide local oscillator signals that may be used for downconversion of the RF signals received by the antenna 2202 and/or upconversion of the signals to be transmitted by the antenna 2202.

The RF device 2200 may include the digital processing unit 2208, which may include one or more processing devices. In some embodiments, the digital processing unit 2208 may be implemented as the processing device 2102 shown in FIG. 16, descriptions of which are provided above (when used as the digital processing unit 2208, the processing device 2102 may, but does not have to, implement any of the boosted switch drivers as described herein). The digital processing unit 2208 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 15, in some embodiments, the RF device 2200 may further include a memory device, e.g., the memory device 2104 as described with reference to FIG. 16, configured to cooperate with the digital processing unit 2208. When used within, or coupled to, the RF device 2200, the memory device 2104 may, but does not have to, implement any of the boosted switch drivers as described herein.

Turning to the details of the RX path that may be included in the RF device 2200, the RX path amplifier 2212 may include a low-noise amplifier (LNA). An input of the RX path amplifier 2212 may be coupled to an antenna port (not shown) of the antenna 2202, e.g., via the duplexer 2204. The RX path amplifier 2212 may amplify the RF signals received by the antenna 2202.

An output of the RX path amplifier 2212 may be coupled to an input of the RX path pre-mix filter 2214, which may be a harmonic or band-pass (e.g., low-pass) filter, configured to filter received RF signals that have been amplified by the RX path amplifier 2212.

An output of the RX path pre-mix filter 2214 may be coupled to an input of the RX path mixer 2216, also referred to as a downconverter. The RX path mixer 2216 may include two inputs and one output. A first input may be configured to receive the RX signals, which may be current signals, indicative of the signals received by the antenna 2202 (e.g., the first input may receive the output of the RX path pre-mix filter 2214). A second input may be configured to receive local oscillator signals from one of the local oscillators 2206. The RX path mixer 2216 may then mix the signals received at its two inputs to generate a downconverted RX signal, provided at an output of the RX path mixer 2216. As used herein, downconversion refers to a process of mixing a received RF signal with a local oscillator signal to generate a signal of a lower frequency. In particular, the TX path mixer (e.g., downconverter) 2216 may be configured to generate the sum and/or the difference frequency at the output port when two input frequencies are provided at the two input ports. In some embodiments, the RF device 2200 may implement a direct-conversion receiver (DCR), also known as homodyne, synchrodyne, or zero-IF receiver, in which case the RX path mixer 2216 may be configured to demodulate the incoming radio signals using local oscillator signals whose frequency is identical to, or very close to the carrier frequency of the radio signal. In other embodiments, the RF device 2200 may make use of downconversion to an intermediate frequency (IF). IFs may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2216 may include several such stages of IF conversion.

Although a single RX path mixer 2216 is shown in the RX path of FIG. 15, in some embodiments, the RX path mixer 2216 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2202 and an in-phase component of the local oscillator signal provided by the local oscillator 2206. The second RX path mixer may be configured for performing downconversion to generate a quadrature (Q) downconverted RX signal by mixing the RX signal received by the antenna 2202 and a quadrature component of the local oscillator signal provided by the local oscillator 2206 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2216 may, optionally, be coupled to the RX path post-mix filter 2218, which may be low-pass filters. In case the RX path mixer 2216 is a quadrature mixer that implements the first and second mixers as described above, the in-phase and quadrature components provided at the outputs of the first and second mixers respectively may be coupled to respective individual first and second RX path post-mix filters included in the filter 2218.

The ADC 2220 may be configured to convert the mixed RX signals from the RX path mixer 2216 from analog to digital domain. The ADC 2220 may be a quadrature ADC that, like the RX path quadrature mixer 2216, may include two ADCs, configured to digitize the downconverted RX path signals separated in in-phase and quadrature components. The output of the ADC 2220 may be provided to the digital processing unit 2208, configured to perform various functions related to digital processing of the RX signals so that information encoded in the RX signals can be extracted. One or more of any embodiments of the boosted switch drivers as described herein may be included within the ADC 2220.

Turning to the details of the TX path that may be included in the RF device 2200, the digital signal to later be transmitted (TX signal) by the antenna 2202 may be provided, from the digital processing unit 2208, to the DAC 2230. Like the ADC 2220, the DAC 2230 may include two DACs, configured to convert, respectively, digital I- and Q-path TX signal components to analog form.

Optionally, the output of the DAC 2230 may be coupled to the TX path pre-mix filter 2228, which may be a bandpass (e.g., low-pass) filter (or a pair of band-pass, e.g., low-pass, filters, in case of quadrature processing) configured to filter out, from the analog TX signals output by the DAC 2230, the signal components outside of the desired band. The digital TX signals may then be provided to the TX path mixer 2226, which may also be referred to as an upconverter. Like the RX path mixer 2216, the TX path mixer 2226 may include a pair of TX path mixers, for in-phase and quadrature component mixing. Like the first and second RX path mixers that may be included in the RX path, each of the TX path mixers of the TX path mixer 2226 may include two inputs and one output. A first input may receive the TX signal components, converted to the analog form by the respective DAC 2230, which are to be upconverted to generate RF signals to be transmitted. The first TX path mixer may generate an in-phase (I) upconverted signal by mixing the TX signal component converted to analog form by the DAC 2230 with the in-phase component of the TX path local oscillator signal provided from the local oscillator 2206 (in various embodiments, the local oscillator 2206 may include a plurality of different local oscillators, or be configured to provide different local oscillator frequencies for the mixer 2216 in the RX path and the mixer 2226 in the TX path). The second TX path mixer may generate a quadrature phase (Q) upconverted signal by mixing the TX signal component converted to analog form by the DAC 2230 with the quadrature component of the TX path local oscillator signal. The output of the second TX path mixer may be added to the output of the first TX path mixer to create a real RF signal. A second input of each of the TX path mixers may be coupled the local oscillator 2206.

Optionally, the RF device 2200 may include the TX path post-mix filter 2224, configured to filter the output of the TX path mixer 2226.

The TX path amplifier 2222 may be a power amplifier (PA), configured to amplify the upconverted RF signal before providing it to the antenna 2202 for transmission.

In various embodiments, any of the RX path pre-mix filter 2214, the RX path post-mix filter 2218, the TX post-mix filter 2224, and the TX pre-mix filter 2228 may be implemented as RF filters. In some embodiments, an RF filter may be implemented as a plurality of RF filters, or a filter bank. A filter bank may include a plurality of RF filters that may be coupled to a switch, e. g., the RF switch 2234, configured to selectively switch any one of the plurality of RF filters on and off (e.g., activate any one of the plurality of RF filters), in order to achieve desired filtering characteristics of the filter bank (i.e., in order to program the filter bank). For example, such a filter bank may be used to switch between different RF frequency ranges when the RF device 2200 is, or is included in, a BS or in a UE device. In another example, such a filter bank may be programmable to suppress TX leakage on the different duplex distances.

The impedance tuner 2232 may include any suitable circuitry, configured to match the input and output impedances of the different RF circuitries to minimize signal losses in the RF device 2200. For example, the impedance tuner 2232 may include an antenna impedance tuner. Being able to tune the impedance of the antenna 2202 may be particularly advantageous because antenna's impedance is a function of the environment that the RF device 2200 is in, e.g., antenna's impedance changes depending on, e.g., if the antenna is held in a hand, placed on a car roof, etc.

As described above, the RF switch 2234 may be a device configured to route high-frequency signals through transmission paths, e.g., in order to selectively switch between a plurality of instances of any one of the components shown in FIG. 15, e.g., to achieve desired behavior and characteristics of the RF device 2200. For example, in some embodiments, an RF switch may be used to switch between different antennas 2202. In other embodiments, an RF switch may be used to switch between a plurality of RF filters (e.g., by selectively switching RF filters on and off) of the RF device 2200. Typically, an RF system would include a plurality of such RF switches.

The RF device 2200 provides a simplified version and, in further embodiments, other components not specifically shown in FIG. 15 may be included. For example, the RX path of the RF device 2200 may include a current-to-voltage amplifier between the RX path mixer 2216 and the ADC 2220, which may be configured to amplify and convert the downconverted signals to voltage signals. In another example, the RX path of the RF device 2200 may include a balun transformer for generating balanced signals. In yet another example, the RF device 2200 may further include a clock generator, which may, e.g., include a suitable phased-lock loop (PLL), configured to receive a reference clock signal and use it to generate a different clock signal that may then be used for timing the operation of the ADC 2220, the DAC 2230, and/or that may also be used by the local oscillator 2206 to generate the local oscillator signals to be used in the RX path or the TX path.

Example Data Processing System

FIG. 16 provides a block diagram illustrating an example data processing system 2300 that may be configured to control operation of one or more boosted switch drivers as described herein, according to some embodiments of the present disclosure. For example, the data processing system 2300 may be configured to implement or control portions of the boosted switch drivers 204, 804, or any further embodiments of the boosted switch drivers as described herein. In another example, the data processing system 2300 may be configured to implement at least portions of the control logic 2236, shown in FIG. 15.

As shown in FIG. 16, the data processing system 2300 may include at least one processor 2302, e.g. a hardware processor 2302, coupled to memory elements 2304 through a system bus 2306. As such, the data processing system may store program code within memory elements 2304. Further, the processor 2302 may execute the program code accessed from the memory elements 2304 via a system bus 2306. In one aspect, the data processing system may be implemented as a computer that is suitable for storing and/or executing program code. It should be appreciated, however, that the data processing system 2300 may be implemented in the form of any system including a processor and a memory that is capable of performing the functions described within this disclosure.

In some embodiments, the processor 2302 can execute software or an algorithm to perform the activities as discussed in the present disclosure, in particular activities related to operating boosted switch drivers as described herein. The processor 2302 may include any combination of hardware, software, or firmware providing programmable logic, including by way of non-limiting example a microprocessor, a digital signal processor (DSP), a field-programmable gate array (FPGA), a programmable logic array (PLA), an application specific IC (ASIC), or a virtual machine processor. The processor 2302 may be communicatively coupled to the memory element 2304, for example in a direct-memory access (DMA) configuration, so that the processor 2302 may read from or write to the memory elements 2304.

In general, the memory elements 2304 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 2300 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any elements illustrating boosted switch drivers as shown in FIGS. 1-12, can also include suitable interfaces for receiving, transmitting, and/or otherwise communicating data or information in a network environment so that they can communicate with, e.g., the data processing system 2300.

In certain example implementations, mechanisms for implementing one or more boosted switch drivers as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 2304 shown in FIG. 16, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 2302 shown in FIG. 16, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 2304 may include one or more physical memory devices such as, for example, local memory 2308 and one or more bulk storage devices 2310. The local memory may refer to RAM or other non-persistent memory device(s) generally used during actual execution of the program code. A bulk storage device may be implemented as a hard drive or other persistent data storage device. The processing system 2300 may also include one or more cache memories (not shown) that provide temporary storage of at least some program code in order to reduce the number of times program code must be retrieved from the bulk storage device 2310 during execution.

As shown in FIG. 16, the memory elements 2304 may store an application 2318. In various embodiments, the application 2318 may be stored in the local memory 2308, the one or more bulk storage devices 2310, or apart from the local memory and the bulk storage devices. It should be appreciated that the data processing system 2300 may further execute an operating system (not shown in FIG. 16) that can facilitate execution of the application 2318. The application 2318, being implemented in the form of executable program code, can be executed by the data processing system 2300, e.g., by the processor 2302. Responsive to executing the application, the data processing system 2300 may be configured to perform one or more operations or method steps described herein.

Input/output (I/O) devices depicted as an input device 2312 and an output device 2314, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 2314 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 2314. Input and/or output devices 2312, 2314 may be coupled to the data processing system either directly or through intervening I/O controllers.

In an embodiment, the input and the output devices may be implemented as a combined input/output device (illustrated in FIG. 16 with a dashed line surrounding the input device 2312 and the output device 2314). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 2316 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 2300, and a data transmitter for transmitting data from the data processing system 2300 to said systems, devices and/or networks. Modems, cable modems, and Ethernet cards are examples of different types of network adapter that may be used with the data processing system 2300.

SELECT EXAMPLES

The following paragraphs provide various examples of the embodiments disclosed herein.

Example 1 provides a switch driver circuit that includes an input, configured to receive an input clock signal; an output, configured to provide an output clock signal; a first transistor (e.g., transistor m5 shown in the present drawings); a second transistor (e.g., transistor m6 shown in the present drawings), where each of the first and the second transistors includes a first terminal (e.g., a gate terminal) and a second terminal (e.g., a drain terminal) and where one of the first and second transistors is a P-type transistor (e.g., a PMOS transistor) and the other one is an N-type transistor (e.g., an NMOS transistor); and a level shifter circuit, configured to level-shift the input clock signal to generate a level-shifted input clock signal. The first terminal of the first transistor is configured to receive a signal indicative of the input clock signal (e.g., the input clock signal itself, or a version of the input clock signal that has been level-shifted in a manner complementary to the level-shifting of the signal to be provided to the second transistor), the first terminal of the second transistor is configured to receive a signal indicative of the level-shifted input clock signal, and each of the second terminal of the first transistor and the second terminal of the second transistor is coupled to the output (i.e., the second terminal of the first transistor is coupled to the second terminal of the second transistor, and both are coupled to the output).

Example 2 provides the switch driver circuit according to example 1, where the input clock signal has a low voltage value and a high voltage value, and level-shifting of the input clock signal includes the level shifter circuit changing each of the low voltage value and the high voltage value of the input signal to generate the level-shifted input signal.

Example 3 provides the switch driver circuit according to examples 1 or 2, where the level shifter circuit includes a coupling capacitor and a voltage controller circuit, and the first terminal of the second transistor is configured to receive the signal indicative of the level-shifted input clock signal by a first capacitor electrode being coupled to the input and a second capacitor electrode being coupled to each of the voltage controller circuit and the first terminal of the second transistor.

Example 4 provides the switch driver circuit according to example 3, where voltage controller circuit is configured to control a high voltage value in the level-shifted input clock signal. Such a voltage controller circuit may be referred to as a "max level controller" because it sets the maximum voltage value of the level-shifted input clock signal. The minimum voltage value is then adjusted automatically based on a ratio between the capacitance of the coupling capacitor and the capacitance of the load for the voltage controller circuit.

Example 5 provides the switch driver circuit according to example 4, where a third terminal of the second transistor is coupled to a supply voltage, and a value of the supply voltage corresponds to (e.g., is substantially equal to) the high voltage in the level-shifted input clock signal.

Example 6 provides the switch driver circuit according to examples 4 or 5, where the voltage controller circuit includes a cross-coupled pair of transistors, each of which includes a first terminal (e.g., a gate terminal), a second terminal (e.g., a drain terminal), and a third terminal (e.g., a source terminal), the first terminal of a first transistor of the cross-coupled pair of transistors is coupled to the second terminal of a second transistor of the cross-coupled pair of transistors, the first terminal of the second transistor of the cross-coupled pair of transistors is coupled to the second terminal of the first transistor of the cross-coupled pair of transistors, the third terminal of each of the first transistor of the cross-coupled pair of transistors and the second transistor of the cross-coupled pair of transistors is coupled to a reference voltage, and a value of the reference voltage corresponds to (e.g., is substantially equal to) the high voltage in the level-shifted input clock signal.

Example 7 provides the switch driver circuit according to any one of examples 4-6, where the first transistor is an N-type transistor and the second transistor is a P-type transistor.

Example 8 provides the switch driver circuit according to any one of examples 4-6, where the level shifter circuit is a first level shifter circuit, the switch driver circuit further includes a second level shifter circuit, and the second level shifter circuit is configured to control a low voltage level in the output clock signal.

Example 9 provides the switch driver circuit according to example 3, where voltage controller circuit is configured to control a low voltage value in the level-shifted input clock signal. Such a voltage controller circuit may be referred to as a "min level controller" because it sets the minimum voltage value of the level-shifted input clock signal. The maximum voltage value is then adjusted automatically based on a ratio between the capacitance of the coupling capacitor and the capacitance of the load for the voltage controller circuit.

Example 10 provides the switch driver circuit according to example 9, where a third terminal of the second transistor is coupled to a supply voltage, and a value of the supply voltage corresponds to (e.g., is substantially equal to) the low voltage in the level-shifted input clock signal.

Example 11 provides the switch driver circuit according to examples 9 or 10, where the voltage controller circuit includes a cross-coupled pair of transistors, each of which includes a first terminal (e.g., a gate terminal), a second terminal (e.g., a drain terminal), and a third terminal (e.g., a source terminal). The first terminal of a first transistor of the cross-coupled pair of transistors is coupled to the second terminal of a second transistor of the cross-coupled pair of transistors, the first terminal of the second transistor of the cross-coupled pair of transistors is coupled to the second terminal of the first transistor of the cross-coupled pair of transistors, the third terminal of each of the first transistor of the cross-coupled pair of transistors and the second transistor of the cross-coupled pair of transistors is coupled to a supply voltage, and a value of the supply voltage corresponds to (e.g., is substantially equal to) the low voltage in the level-shifted input clock signal.

Example 12 provides the switch driver circuit according to any one of examples 9-11, where the first transistor is a P-type transistor and the second transistor is an N-type transistor.

Example 13 provides the switch driver circuit according to any one of examples 9-12, where the level shifter circuit is a first level shifter circuit, the switch driver circuit further includes a second level shifter circuit, and the second level shifter circuit is configured to control a high voltage level in the output clock signal.

Example 14 provides the switch driver circuit according to any one of the preceding examples, further including a third transistor, coupled to the first transistor in a cascode arrangement, where the second terminal of the first transistor is coupled to the output by having the second terminal of the first transistor being coupled to a third terminal (e.g., a source terminal) of the third transistor, and having a second terminal (e.g., a drain terminal) of the third transistor being coupled to the output.

In various embodiments, a first terminal (e.g., a gate terminal) of the third transistor may be coupled to a suitable reference voltage. For example, the reference voltage may be approximately 1 V for the embodiments where the third transistor is an N-type transistor, or approximately 0 V (ground) for the embodiments where the third transistor is a P-type transistor.

Example 15 provides the switch driver circuit according to any one of the preceding examples, where each of the first and the second transistors is a field-effect transistor, and where the first terminal is a gate terminal, the second terminal is a drain terminal, and the third terminal is a source terminal.

Example 16 provides a switch driver circuit that includes a first branch including a first transistor (e.g., transistor m5 shown in the present drawings); and a second branch including a second transistor (e.g., transistor m6 shown in the present drawings) and a level shifter circuit. An input clock signal is to be split between the first branch and the second branch, so that a signal indicative of a portion of the input clock signal split to the first branch is provided to the first transistor, and a portion of the input clock signal split to the second branch is level-shifted by the level shifter circuit to generate a level-shifted input clock signal and a signal indicative of the level-shifted input clock signal is provided to the second transistor. One of the first transistor and the second transistor is an N-type transistor and other one is a P-type transistor. An output of the first transistor and an output of the second transistor is combined to generate an output clock signal.

Example 17 provides the switch driver circuit according to example 16, where each of the first and the second transistors includes a first terminal (e.g., a gate terminal), a second terminal (e.g., a drain terminal), and a third terminal (e.g., a source terminal), the signal indicative of the portion of the input clock signal split to the first branch is provided to the first terminal of the first transistor, and the signal indicative of the level-shifted input clock signal is provided to the first terminal of the second transistor.

Example 18 provides the switch driver circuit according to example 17, where the level shifter circuit includes a capacitor and a voltage controller circuit, portion of the input clock signal split to the second branch is configured to be applied to a first capacitor electrode of the capacitor, and a second capacitor electrode of the capacitor is coupled to each of an output of the voltage controller circuit and to the first terminal of the second transistor.

Example 19 provides the switch driver circuit according to examples 17 or 18, where the second terminal of the first transistor is coupled to the second terminal of the second transistor, the third terminal of the first transistor is coupled to a first supply voltage, and the third terminal of the second transistor is coupled to a second supply voltage.

Example 20 provides a method of fabricating a switch driver circuit, the method including providing an input, configured to receive an input clock signal; providing an output, configured to provide an output clock signal; providing a first transistor (e.g., transistor m5 shown in the present drawings); providing a second transistor (e.g., transistor m6 shown in the present drawings), where each of the first and the second transistors includes a first terminal (e.g., a gate terminal) and a second terminal (e.g., a drain terminal) and where one of the first and second transistors is a P-type transistor (e.g., a PMOS transistor) and the other one is an N-type transistor (e.g., an NMOS transistor); and providing a level shifter circuit, configured to level-shift the input clock signal to generate a level-shifted input clock signal, where the first terminal of the first transistor is configured to receive a signal indicative of the input clock signal, the first terminal of the second transistor is configured to receive a signal indicative of the level-shifted input clock signal, and each of the second terminal of the first transistor and the second terminal of the second transistor is coupled to the output (i.e., the second terminal of the first transistor is coupled to the second terminal of the second transistor, and both are coupled to the output).

Example 21 provides the method according to example 20, where the switch driver circuit is the switch driver circuit according to any one of examples 1-19.

Variations and Implementations

While embodiments of the present disclosure were described above with references to exemplary implementations as shown in FIGS. 1-16, a person skilled in the art will realize that the various teachings described above are applicable to a large variety of other implementations.

In the discussions of the embodiments above, components of a system, such as e.g. inverters, resistors, transistors, and/or other components can readily be replaced, substituted, or otherwise modified to accommodate particular circuitry needs. Moreover, it should be noted that the use of complementary electronic devices, hardware, software, etc. offer an equally viable option for implementing the teachings of the present disclosure related to implementing one or more boosted switch drivers.

Parts of various systems for implementing one or more boosted switch drivers as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In some embodiments, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In some embodiments, the electrical circuits of the present figures may be implemented as stand-alone modules (e.g., a device with associated components and circuitry configured to perform a specific application or function) or implemented as plug-in modules into application specific hardware of electronic devices. Note that embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

All of the specifications, dimensions, and relationships outlined herein (e.g., the number of components of the boosted switch drivers, or portions thereof, shown in the present drawings, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the present drawings may be combined in various possible configurations, all of which are clearly within the broad scope of the present disclosure. In certain cases, it may be easier to describe one or more of the functionalities of a given set of flows by only referencing a limited number of electrical elements. It should be appreciated that the electrical circuits of the present figures and its teachings are readily scalable and can accommodate many components, as well as more complicated or sophisticated arrangements and configurations. Accordingly, the examples provided should not limit the scope or inhibit the broad teachings of the electrical circuits as potentially applied to a myriad of other architectures.

Furthermore, functions related to implementing one or more boosted switch drivers as proposed herein illustrate only some of the possible functions that may be executed by, or within, system illustrated in the present figures. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Note that all optional features of the apparatus described above may also be implemented with respect to the method or process described herein and specifics in the examples may be used anywhere in one or more embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

The invention claimed is:

1. A switch driver circuit, comprising:
an input, to receive an input clock signal;
an output, to provide an output clock signal;
a first transistor and a second transistor, each including a first terminal and a second terminal;
a third transistor, coupled to the first transistor in a cascode arrangement; and
a level shifter circuit, to level-shift the input clock signal to generate a level-shifted input clock signal,
wherein:
the first terminal of the first transistor is to receive a signal indicative of the input clock signal,
the first terminal of the second transistor is to receive a signal indicative of the level-shifted input clock signal,
the second terminal of the first transistor is coupled to a third terminal of the third transistor, and a second terminal of the third transistor is coupled to the output, and
the second terminal of the second transistor is coupled to the output.

2. The switch driver circuit according to claim 1, wherein:
the input clock signal has a low voltage value and a high voltage value, and
level-shifting of the input clock signal includes the level shifter circuit changing each of the low voltage value and the high voltage value of the input clock signal to generate the level-shifted input clock signal.

3. The switch driver circuit according to claim 1, wherein the level shifter circuit includes a coupling capacitor and a voltage controller circuit, and the first terminal of the second transistor is to receive the signal indicative of the level-shifted input clock signal by a first capacitor electrode being coupled to the input and a second capacitor electrode being coupled to each of the voltage controller circuit and the first terminal of the second transistor.

4. The switch driver circuit according to claim 3, wherein voltage controller circuit is to control a high voltage value of the level-shifted input clock signal.

5. The switch driver circuit according to claim 4, wherein:
the voltage controller circuit includes a cross-coupled pair of transistors, each of which includes a first terminal, a second terminal, and a third terminal,
the first terminal of a first transistor of the cross-coupled pair of transistors is coupled to the second terminal of a second transistor of the cross-coupled pair of transistors,
the first terminal of the second transistor of the cross-coupled pair of transistors is coupled to the second terminal of the first transistor of the cross-coupled pair of transistors,
the third terminal of each of the first transistor of the cross-coupled pair of transistors and the second transistor of the cross-coupled pair of transistors is coupled to a reference voltage, and
a value of the reference voltage corresponds to the high voltage of the level-shifted input clock signal.

6. The switch driver circuit according to claim 4, wherein the first transistor is an N-type transistor and the second transistor is a P-type transistor.

7. The switch driver circuit according to claim 4, wherein:
the level shifter circuit is a first level shifter circuit,
the switch driver circuit further includes a second level shifter circuit, and
the second level shifter circuit is to control a low voltage level of the output clock signal.

8. The switch driver circuit according to claim 3, wherein voltage controller circuit is to control a low voltage value of the level-shifted input clock signal.

9. The switch driver circuit according to claim 8, wherein:
the voltage controller circuit includes a cross-coupled pair of transistors, each of which includes a first terminal, a second terminal, and a third terminal,
the first terminal of a first transistor of the cross-coupled pair of transistors is coupled to the second terminal of a second transistor of the cross-coupled pair of transistors,
the first terminal of the second transistor of the cross-coupled pair of transistors is coupled to the second terminal of the first transistor of the cross-coupled pair of transistors,
the third terminal of each of the first transistor of the cross-coupled pair of transistors and the second transistor of the cross-coupled pair of transistors is coupled to a reference voltage, and
a value of the reference voltage corresponds to the low voltage of the level-shifted input clock signal.

10. The switch driver circuit according to claim 8, wherein the first transistor is a P-type transistor and the second transistor is an N-type transistor.

11. The switch driver circuit according to claim 1, wherein each of the first transistor and the second transistor is a field-effect transistor, and wherein the first terminal is a gate terminal, the second terminal is a drain terminal, and the third terminal is a source terminal.

12. The switch driver circuit according to claim 4, wherein a third terminal of the second transistor is coupled to a supply voltage, and a value of the supply voltage corresponds to the high voltage of the level-shifted input clock signal.

13. The switch driver circuit according to claim 8, wherein a third terminal of the second transistor is coupled to a supply voltage, and a value of the supply voltage corresponds to the low voltage of the level-shifted input clock signal.

14. The switch driver circuit according to claim 8, wherein:
the level shifter circuit is a first level shifter circuit,
the switch driver circuit further includes a second level shifter circuit, and
the second level shifter circuit is to control a high voltage level of the output clock signal.

15. A switch driver circuit, comprising:
an input, to receive an input clock signal;
an output, to provide an output clock signal;
a first transistor and a second transistor, each including a first terminal and a second terminal;
a first level shifter circuit, to level-shift the input clock signal to generate a level-shifted input clock signal; and
a second level shifter circuit;
wherein:
the first terminal of the first transistor is to receive a signal indicative of the input clock signal,
the first terminal of the second transistor is to receive a signal indicative of the level-shifted input clock signal,
the second terminal of the second transistor is coupled to the second level shifter circuit,
each of the second terminal of the first transistor and the second terminal of the second transistor is coupled to the output,
the first level shifter circuit is to control a high voltage value of the level-shifted input clock signal, and
the second level shifter circuit is to control a high voltage level of the output clock signal.

16. The switch driver circuit according to claim 15, further comprising a third transistor, coupled to the first transistor in a cascode arrangement, wherein the second terminal of the first transistor is coupled to the output by having the second terminal of the first transistor being coupled to a third terminal of the third transistor, and having a second terminal of the third transistor being coupled to the output.

17. The switch driver circuit according to claim 15, wherein:
the input clock signal has a low voltage value and a high voltage value, and
level-shifting of the input clock signal includes the level shifter circuit changing each of the low voltage value and the high voltage value of the input clock signal to generate the level-shifted input clock signal.

18. The switch driver circuit according to claim 15, wherein the level shifter circuit includes a coupling capacitor and a voltage controller circuit, and the first terminal of the second transistor is to receive the signal indicative of the level-shifted input clock signal by a first capacitor electrode being coupled to the input and a second capacitor electrode being coupled to each of the voltage controller circuit and the first terminal of the second transistor.

19. The switch driver circuit according to claim 18, wherein voltage controller circuit is to control a high voltage value of the level-shifted input clock signal.

20. The switch driver circuit according to claim 19, wherein a third terminal of the second transistor is coupled to a supply voltage, and a value of the supply voltage corresponds to the high voltage of the level-shifted input clock signal.

21. The switch driver circuit according to claim 19, wherein:
the voltage controller circuit includes a cross-coupled pair of transistors, each of which includes a first terminal, a second terminal, and a third terminal,
the first terminal of a first transistor of the cross-coupled pair of transistors is coupled to the second terminal of a second transistor of the cross-coupled pair of transistors,
the first terminal of the second transistor of the cross-coupled pair of transistors is coupled to the second terminal of the first transistor of the cross-coupled pair of transistors,
the third terminal of each of the first transistor of the cross-coupled pair of transistors and the second transistor of the cross-coupled pair of transistors is coupled to a reference voltage, and
a value of the reference voltage corresponds to the high voltage of the level-shifted input clock signal.

22. The switch driver circuit according to claim 19, wherein the first transistor is an N-type transistor and the second transistor is a P-type transistor.

23. The switch driver circuit according to claim 15, wherein each of the first transistor and the second transistor is a field-effect transistor, and wherein the first terminal is a gate terminal, the second terminal is a drain terminal, and the third terminal is a source terminal.

24. A switch driver circuit, comprising:
an input, to receive an input clock signal;
an output, to provide an output clock signal;
a first transistor and a second transistor, each including a first terminal and a second terminal;
a first level shifter circuit, to level-shift the input clock signal to generate a level-shifted input clock signal; and
a second level shifter circuit;
wherein:
the first terminal of the first transistor is to receive a signal indicative of the input clock signal,
the first terminal of the second transistor is to receive a signal indicative of the level-shifted input clock signal,
the second terminal of the second transistor is coupled to the second level shifter circuit,
each of the second terminal of the first transistor and the second terminal of the second transistor is coupled to the output,
the first level shifter circuit is to control a low voltage value of the level-shifted input clock signal, and
the second level shifter circuit is to control a high voltage level of the output clock signal.

25. The switch driver circuit according to claim 24, wherein the first level shifter circuit includes a coupling capacitor and a voltage controller circuit, and the first terminal of the second transistor is to receive the signal indicative of the level-shifted input clock signal by a first capacitor electrode being coupled to the input and a second capacitor electrode being coupled to each of the voltage controller circuit and the first terminal of the second transistor.

26. The switch driver circuit according to claim 25, wherein:
the voltage controller circuit includes a cross-coupled pair of transistors, each of which includes a first terminal, a second terminal, and a third terminal,
the first terminal of a first transistor of the cross-coupled pair of transistors is coupled to the second terminal of a second transistor of the cross-coupled pair of transistors,
the first terminal of the second transistor of the cross-coupled pair of transistors is coupled to the second terminal of the first transistor of the cross-coupled pair of transistors,
the third terminal of each of the first transistor of the cross-coupled pair of transistors and the second transistor of the cross-coupled pair of transistors is coupled to a reference voltage, and
a value of the reference voltage corresponds to the low voltage of the level-shifted input clock signal.

27. The switch driver circuit according to claim 24, wherein the first transistor is a P-type transistor and the second transistor is an N-type transistor.

28. The switch driver circuit according to claim 24, wherein each of the first transistor and the second transistor is a field-effect transistor, and wherein the first terminal is a gate terminal, the second terminal is a drain terminal, and the third terminal is a source terminal.

29. An electronic component, comprising:
one or more switches; and
a switch driver circuit, to drive the one or more switches, the switch driver circuit comprising:
an input, to receive an input clock signal;
an output, to provide an output clock signal;
a first transistor and a second transistor, each including a first terminal and a second terminal;
a third transistor, coupled to the first transistor in a cascode arrangement; and
a level shifter circuit, to level-shift the input clock signal to generate a level-shifted input clock signal,
wherein:
the first terminal of the first transistor is to receive a signal indicative of the input clock signal,
the first terminal of the second transistor is to receive a signal indicative of the level-shifted input clock signal,
the second terminal of the first transistor is coupled to a third terminal of the third transistor, and a second terminal of the third transistor is coupled to the output, and
the second terminal of the second transistor is coupled to the output.

30. The electronic component according to claim 29, wherein the electronic component is an analog-to-digital converter.

31. The electronic component according to claim 29, wherein the electronic component is a radio frequency transceiver.

32. The electronic component according to claim 31, wherein the electronic component further includes control logic to control operation of the switch driver circuit.

33. The electronic component according to claim 31, wherein the electronic component further includes an analog-to-digital converter, and wherein the analog-to-digital converter includes the switch driver circuit.

34. The electronic component according to claim 29, wherein:
the level shifter circuit is a first level shifter circuit,
the switch driver circuit further includes a second level shifter circuit,
the second terminal of the second transistor is further coupled to the second level shifter circuit,
the first level shifter circuit is to control a high voltage value of the level-shifted input clock signal, and
the second level shifter circuit is to control a high voltage level of the output clock signal.

35. The electronic component according to claim 29, wherein:
the input clock signal has a low voltage value and a high voltage value, and
level-shifting of the input clock signal includes the level shifter circuit changing each of the low voltage value and the high voltage value of the input clock signal to generate the level-shifted input clock signal.

36. An electronic component, comprising:
one or more switches; and
a switch driver circuit, to drive the one or more switches, the switch driver circuit comprising:
an input, to receive an input clock signal;
an output, to provide an output clock signal;
a first transistor and a second transistor, each including a first terminal and a second terminal;
a first level shifter circuit, to level-shift the input clock signal to generate a level-shifted input clock signal; and
a second level shifter circuit;
wherein:
the first terminal of the first transistor is to receive a signal indicative of the input clock signal,
the first terminal of the second transistor is to receive a signal indicative of the level-shifted input clock signal,
the second terminal of the second transistor is coupled to the second level shifter circuit,
each of the second terminal of the first transistor and the second terminal of the second transistor is coupled to the output,
the first level shifter circuit is to control a high voltage value of the level-shifted input clock signal, and
the second level shifter circuit is to control a high voltage level of the output clock signal.

37. The electronic component according to claim 36, wherein the electronic component is an analog-to-digital converter.

38. The electronic component according to claim 36, wherein the electronic component is a radio frequency transceiver.

39. The electronic component according to claim 38, wherein the electronic component further includes control logic to control operation of the switch driver circuit.

40. The electronic component according to claim 38, wherein the electronic component further includes an analog-to-digital converter, and wherein the analog-to-digital converter includes the switch driver circuit.

41. The electronic component according to claim 36, wherein the switch driver circuit further includes a third transistor, coupled to the first transistor in a cascode arrangement, wherein the second terminal of the first transistor is coupled to the output by having the second terminal of the first transistor being coupled to a third terminal of the third transistor, and having a second terminal of the third transistor being coupled to the output.

42. The electronic component according to claim 36, wherein:

the input clock signal has a low voltage value and a high voltage value, and level-shifting of the input clock signal includes the level shifter circuit changing each of the low voltage value and the high voltage value of the input clock signal to generate the level-shifted input clock signal.

\* \* \* \* \*